United States Patent
Panian et al.

(10) Patent No.: US 12,079,055 B2
(45) Date of Patent: Sep. 3, 2024

(54) INPUT-OUTPUT VOLTAGE CONTROL FOR DATA COMMUNICATION INTERFACE

(71) Applicant: QUALCOMM Incorporated, San Diego, CA (US)

(72) Inventors: James Lionel Panian, San Marcos, CA (US); John Eaton, San Diego, CA (US); Lakshmi Baskaran, San Diego, CA (US); Shrinivas Gopalan Uppili, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 225 days.

(21) Appl. No.: 17/949,968

(22) Filed: Sep. 21, 2022

(65) Prior Publication Data
US 2024/0094792 A1    Mar. 21, 2024

(51) Int. Cl.
G06F 1/28     (2006.01)
G06F 13/42    (2006.01)
H03K 19/0185  (2006.01)

(52) U.S. Cl.
CPC ............ *G06F 1/28* (2013.01); *G06F 13/4221* (2013.01); *H03K 19/018507* (2013.01); *G06F 2213/0026* (2013.01)

(58) Field of Classification Search
None
See application file for complete search history.

(56) References Cited

U.S. PATENT DOCUMENTS

| | | | |
|---|---|---|---|
| 6,901,457 B1 * | 5/2005 | Toombs | G06K 19/07732 710/301 |
| 8,618,834 B2 | 12/2013 | Mangattur et al. | |
| 9,760,525 B2 | 9/2017 | Glaser | |
| 2010/0174866 A1 * | 7/2010 | Fujimoto | G06F 12/0246 711/170 |

(Continued)

FOREIGN PATENT DOCUMENTS

CN    104407842 B    6/2018

OTHER PUBLICATIONS

Teledyne Lecroy: "PCIe to M.2 Socket 3 Adapter for PCI Express 5.0 Supports M-Key User Manual and Quick Start Guide", 2021, 8 Pages.

(Continued)

*Primary Examiner* — Nimesh G Patel
(74) *Attorney, Agent, or Firm* — Loza & Loza, LLP/Qualcomm

(57) ABSTRACT

Aspects relate to techniques for controlling signal voltage levels across a wired data link for data communication between apparatuses. A first device can advertise multiple supported signal voltage levels to a peer device connected by the wired data link. The devices can implement the same signal voltage level(s) or different signal voltage levels. The peer devices can compare and select a compatible signal voltage level for data communication. The first device can provide a signal voltage indication signal that is configurable to a plurality of voltage levels corresponding to a plurality of signal voltages. At least one of the plurality of voltage levels can indicate that the first device can operate the data link at a plurality of signal voltages. In some examples, the wired data link can be a peripheral component interconnect express (PCIe) link.

37 Claims, 14 Drawing Sheets

(56) References Cited

U.S. PATENT DOCUMENTS

| | | | |
|---|---|---|---|
| 2017/0235701 A1 | 8/2017 | Pethe et al. | |
| 2018/0145530 A1* | 5/2018 | Lee | H02J 7/00047 |
| 2021/0365398 A1 | 11/2021 | Chih et al. | |
| 2021/0367434 A1* | 11/2021 | Jung | H02J 7/0071 |
| 2022/0014032 A1* | 1/2022 | Peng | H02J 9/061 |
| 2022/0093156 A1* | 3/2022 | Matsumoto | G11C 16/30 |
| 2023/0273891 A1* | 8/2023 | Hegde | G06F 13/4282 |
| | | | 710/313 |

OTHER PUBLICATIONS

International Search Report and Written Opinion—PCT/US2023/071412—ISA/EPO—Nov. 7, 2023.

Panian J., et al., "M.2 Socket-1 Enhancements", Peripheral Component Interconnect Special Interest Group, Peripheral Component Interconnect Special Interest Group, 3855 Sw 153RD Drive Beaverton, OR 97003, US, Jun. 24, 2020, pp. 1-14, XP040719079, pp. 8,9.

* cited by examiner

INPUT-OUTPUT VOLTAGE CONTROL FOR DATA COMMUNICATION INTERFACE

TECHNICAL FIELD

The technology discussed below relates generally to data communication interface, and more particularly, to input-output voltage control of data communication interface.

INTRODUCTION

High-speed data communication interfaces are frequently used between circuits and components of mobile wireless devices and other complex systems. For example, certain devices may include processing, communications, storage, and/or display devices that interact with one another through one or more high-speed interfaces. Some of these devices, including synchronous dynamic random-access memory (SDRAM), may be capable of providing or consuming data and control information at processor clock rates. Other devices, e.g., display controllers, may use variable amounts of data at relatively low video refresh rates.

The peripheral component interconnect express (PCIe) standard is an example of a high-speed data communication interface that supports a high-speed link capable of transmitting data at multiple gigabits per second. The PCIe interface also has multiple standby modes for when a link is inactive. PCIe provides lower latency and higher data transfer rates compared to parallel buses. PCIe is specified for communication between a wide range of different devices. Typically, one device, e.g., a processor or hub, acts as a host, that communicates with multiple devices, referred to as endpoints, through PCIe links. The peripheral devices or components may include graphics adapter cards, network interface cards (NICs), storage accelerator devices, mass storage devices, Input/Output interfaces, and other high-performance peripherals.

A data communication connection between any two devices (e.g., PCIe devices) is referred to as a link. A PCIe link is built around a duplex, serial (1-bit), differential, point-to-point connection referred to as a lane. With PCIe, data is transferred over two signal pairs: two lines (wires, circuit board traces, etc.) for transmitting and two lines for receiving. The transmitting and receiving pairs are separate differential pairs for a total of four data lines per lane. The link encompasses a set of lanes, and each lane is capable of sending and receiving data packets simultaneously between the host and the endpoint.

In some aspects, a PCIe link can have one or more separate lanes. For example, a PCIe link can have 1, 2, 4, 8, 12, or 16 lanes, which may be labeled as x1, x2, x4, x8, x12, and x16, respectively, where the number is effectively the number of lanes. In an example, a PCIe x1 implementation has four lines to connect one wire-pair lane in each direction while a PCIe x16 implementation has 16 times that amount for 16 lanes or 64 lines.

BRIEF SUMMARY

The following presents a summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

Aspects relate to techniques for controlling input-output voltages of a data communication interface. In some aspects, the data communication interface may be a wired data link, for example, a peripheral component interconnect express (PCIe) interface. In some aspects, techniques are provided for controlling signal voltage levels across a wired data link (e.g., PCIe link). For example, a PCIe endpoint can advertise one or more supported sideband voltage levels to a host. The host can implement the same or different sideband voltage levels. The host can compare and select a compatible sideband voltage level. Aspects of the disclosure provide backward compatible techniques for sideband voltage negotiation. The techniques allow a PCIe adapter and a PCIe platform to negotiate to lower sideband voltages.

In one aspect of the disclosure, an apparatus for data communication includes an interface circuit configured to provide an interface with a wired data link. The interface circuit is further configured to provide a voltage indication signal that is configurable to one of a plurality of voltage levels corresponding to a plurality of signal voltages, at least one of the plurality of voltage levels capable of indicating two or more of the plurality of signal voltages. The apparatus further includes a controller configured to operate the wired data link using a signal voltage indicated by the voltage indication signal.

In one aspect of the disclosure, a method of operating an apparatus for data communication includes: providing a voltage indication signal that is configurable to one of a plurality of voltage levels corresponding to a plurality of signal voltages, at least one of the plurality of voltage levels capable of indicating two or more of the plurality of signal voltages. The method further includes operating a wired data link using a signal voltage indicated by the voltage indication signal.

In one aspect of the disclosure, an apparatus for data communication includes an interface circuit configured to provide an interface with a wired data link, configured to receive a voltage indication signal that is configurable to one of a plurality of voltage levels corresponding to a plurality of signal voltages, at least one of the plurality of voltage levels capable of indicating two or more of the plurality of signal voltages. The apparatus further includes a controller configured to operate the wired data link using a signal voltage indicated by the voltage indication signal.

In one aspect of the disclosure, a method of operating an apparatus for data communication includes receiving a voltage indication signal that is configurable to one of a plurality of voltage levels corresponding to a plurality of signal voltages, at least one of the plurality of voltage levels capable of indicating two or more of the plurality of signal voltages. The method further includes operating a wired data link using a signal voltage indicated by the voltage indication signal.

In one aspect of the disclosure, an apparatus for data communication includes an interface circuit configured to provide an interface with a wired data link, the interface circuit further configured to provide a voltage indication signal configured to indicate a plurality of signal voltage levels of the interface circuit, the voltage indication signal configurable to one of a power supply voltage, a ground voltage, and one or more voltages between the power supply voltage and the ground voltage. The apparatus further includes a controller configured to operate the wired data link using a signal voltage level indicated by the voltage indication signal.

In one aspect of the disclosure, an apparatus for data communication includes an interface circuit configured to provide an interface with a wired data link, the interface circuit configured to receive a voltage indication signal that is configured to indicate a plurality of signal voltage levels, the voltage indication signal configurable to a power supply voltage, a ground voltage, and one or more voltages between the power supply voltage and the ground voltage. The apparatus further includes a controller configured to operate the wired data link using a signal voltage level indicated by the voltage indication signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, these concepts may be practiced without these specific details. In some instances, well-known structures and components are shown in block diagram form in order to avoid obscuring such concepts.

Figure 1:
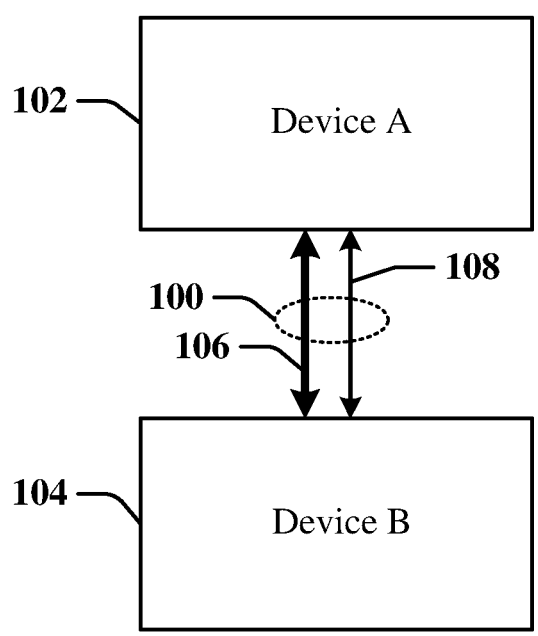
FIG. 1 is a block diagram illustrating an exemplary data communication connection according to some aspects of the present disclosure.

FIG. 1 is a block diagram illustrating an exemplary data communication connection 100 according to some aspects of the disclosure. The data communication connection 100 may provide a data link between a first device 102 (device A) and a second device 104 (device B). The data communication connection 100 may include a high-speed data path 106 and a low-speed data path 108. In some aspects, the high-speed data path 106 can be used for the data payload, and the low-speed data path 108 can be used for various control and/or signaling functions of the data communication connection 100. In some aspects, the data communication connection 100 may be a peripheral component interconnect express (PCIe) connection. In this example, the low-speed data path 108 may carry PCIe sideband signals. The first device 102 and the second device 104 may each be provided with a PCIe interface to utilize the data communication connection 100 for data communication between the devices. In this disclosure, a device equipped with a PCIe interface may be referred to as a PCIe device.

Peripheral component interconnect express (PCIe) devices can communicate using sideband signals that can include, for example, interrupts, power-management signals, and reset commands. The current PCIe standard can support either 1.8V or 3.3V sideband voltage level. In general, PCIe devices negotiate to 3.3V sideband voltage level, which may require the use of space-consuming level shifters between PCIe devices operating at different sideband voltages.

Some aspects of the disclosure relate to techniques for managing signal voltage levels across a wired data link, e.g., PCIe link In some aspects, a PCIe adapter (e.g., PCIe endpoint) can advertise one or more supported sideband voltage levels to a PCIe platform (e.g., host). A PCIe platform can implement the same sideband voltage(s) or different sideband voltage levels. In some aspects, a PCIe Platform can compare and select a compatible sideband voltage level. The present disclosure is not limited to the examples described here. The present disclosure may be used for future implementations of the PCIe standard (e.g., GEN6 and beyond). Furthermore, while the present disclosure is discussed in relation to PCIe examples, the underlying principles of the disclosed systems and methods may be implemented in other types of wired data links (e.g., other physical serial interconnects) between host and client devices.

Figure 2:
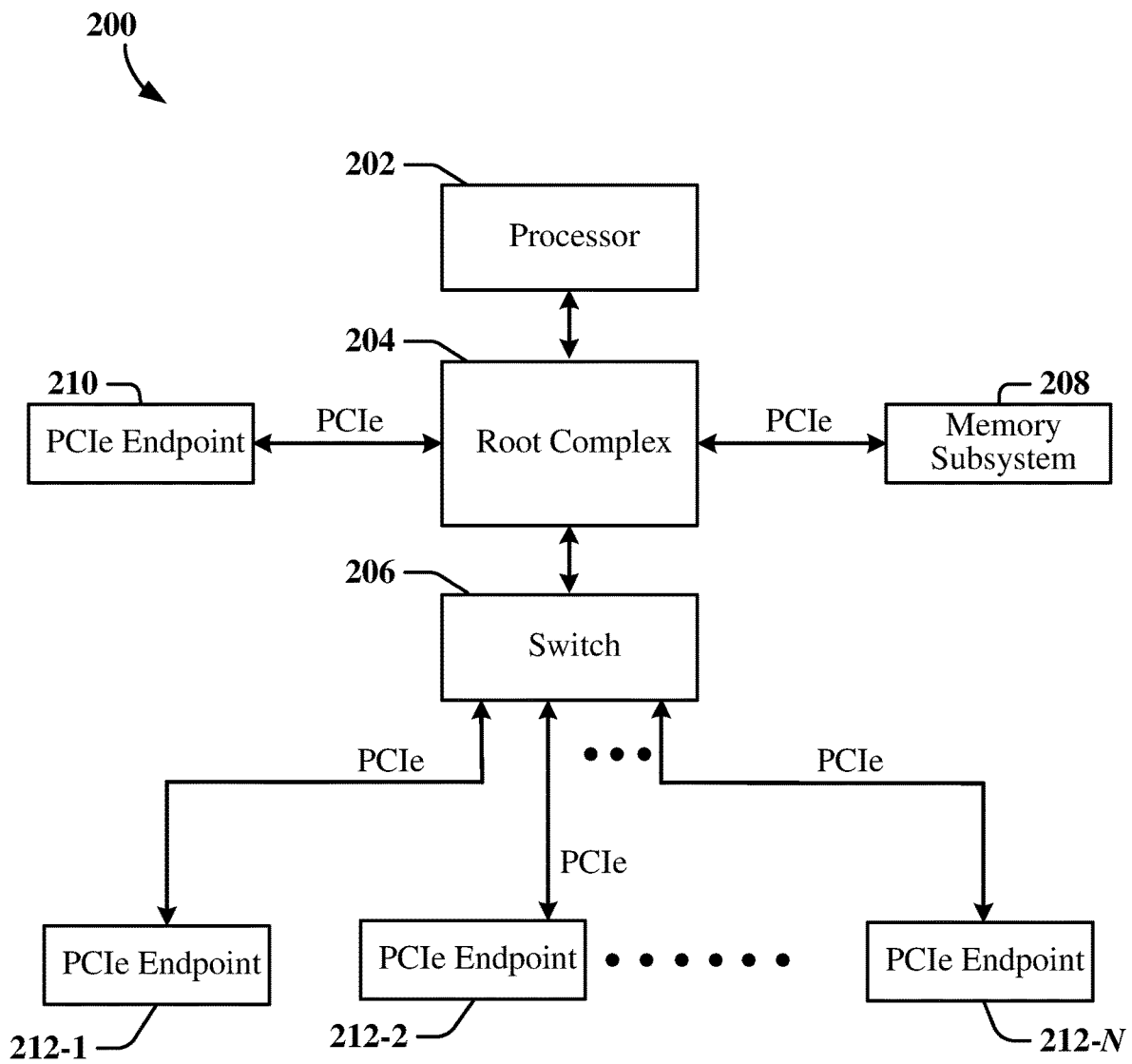
FIG. 2 is a block diagram of a computing architecture with peripheral component interconnect express (PCIe) interfaces suitable for aspects of the present disclosure.

FIG. 2 is a block diagram of an exemplary computing architecture using PCIe interfaces. The computing architecture 200 operates using multiple high-speed PCIe interface serial links A PCIe interface may be characterized as an apparatus comprising a point-to-point topology, where separate serial links connect each device to a host, which can be referred to as a root complex 204. In the computing architecture 200, the root complex 204 couples a processor 202 to memory devices, e.g., the memory subsystem 208, and a PCIe switch circuit 206. In some instances, the PCIe switch circuit 206 includes cascaded switch devices. One or more PCIe endpoint devices 210 may be coupled directly to the root complex 204, while other PCIe endpoint devices 212-1, 212-2, . . . 212-N may be coupled to the root complex 204 through the PCIe switch circuit 206. The root complex 204 may be coupled to the processor 202 using a proprietary local bus interface or a standards defined local bus interface. The root complex 204 may control configuration and data transactions through the PCIe interfaces and may generate transaction requests for the processor 202. In some examples, the root complex 204 is implemented in the same Integrated Circuit (IC) device that includes the processor 202. The root complex 204 can support multiple PCIe ports.

The root complex 204 may control communication between the processor 202 and the memory subsystem 208 which is one example of an endpoint. The root complex 204 also controls communication between the processor 202 and other PCIe endpoint devices 210, 212-1, 212-2, . . . 212-N. The PCIe interface may support full-duplex communication between any two endpoints, with no inherent limitation on concurrent access across multiple endpoints. Data packets may carry information through any PCIe link In a multi-lane PCIe link, packet data may be striped across multiple lanes. The number of lanes in the multi-lane link may be negotiated during device initialization and may be different for different endpoints.

When one or both traffic directions of the lanes of the PCIe links are being underutilized by low bandwidth applications that could be adequately served by fewer lanes, then the root complex 204 and endpoint may operate the link with more or fewer transmit lines and receive lines in one or both directions.

In some aspects, the computing architecture 200 may be implemented based on the PCI Express M.2 Specification. The M.2 form factor can be used for mobile adapters. The M.2 enables expansion, contraction, and higher integration of functions onto a single form factor module solution. For example, any of the PCIe endpoints described above relation to FIG. 2 can be implemented as an M.2 adapter, and the root complex 204 can be implemented as an M.2 platform.

Figure 3:
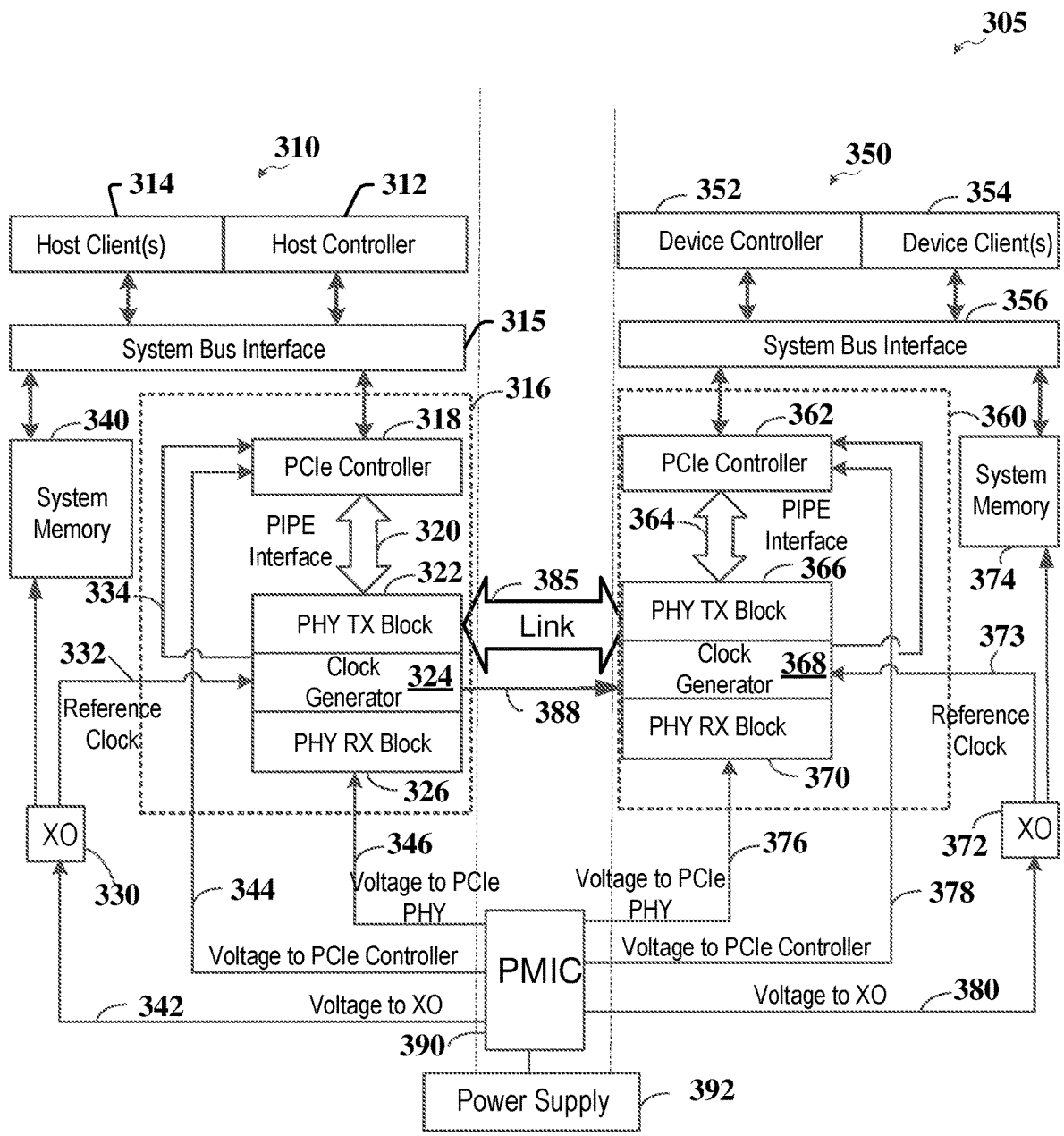
FIG. 3 is a block diagram of a system including a host system and an endpoint device system according to aspects of the present disclosure.

FIG. 3 is a block diagram of an exemplary PCIe system in which aspects of the present disclosure may be implemented. The system 305 includes a host system 310 and an endpoint device system 350. For example, the host system 310 may be an M.2 platform, and the endpoint device system 350 may be an M.2 adapter. The host system 310 may be integrated on a first chip (e.g., system on a chip or SoC), and the endpoint device system 350 may be integrated on a second chip. Alternatively, the host system and/or endpoint device system may be integrated in first and second packages, e.g., SiP, first and second system boards with multiple chips, or in other hardware or any combination. In this example, the host system 310 and the endpoint device system 350 are coupled by a PCIe link 385.

The host system 310 includes one or more host clients 314. Each of the one or more host clients 314 may be implemented on a processor executing software that performs the functions of the host clients 314 discussed herein. For the example of more than one host client, the host clients may be implemented on the same processor or different processors. The host system 310 also includes a host controller 312, which may perform root complex functions. The host controller 312 may be implemented on a processor executing software that performs the functions of the host controller 312 discussed herein.

The host system 310 includes a PCIe interface circuit 316, a system bus interface 315, and a host system memory 340. The system bus interface 315 may interface the one or more host clients 314 with the host controller 312, and interface each of the one or more host clients 314 and the host controller 312 with the PCIe interface circuit 316 and the host system memory 340. The PCIe interface circuit 316 provides the host system 310 with an interface to the PCIe link 385. In this regard, the PCIe interface circuit 316 is configured to transmit data (e.g., from the host clients 314) to the endpoint device system 350 over the PCIe link 385 and receive data from the endpoint device system 350 via the PCIe link 385. The PCIe interface circuit 316 includes a PCIe controller 318, a physical interface for PCI Express (PIPE) interface 320, a physical (PHY) transmit (TX) block 322, a clock generator 324, and a PHY receive (RX) block 326. The PIPE interface 320 provides a parallel interface between the PCIe controller 318 and the PHY TX block 322 and the PHY RX block 326. The PCIe controller 318 (which may be implemented in hardware) may be configured to perform transaction layer, data link layer, and control flow functions specified in the PCIe specification, as discussed further below.

The host system 310 also includes an oscillator (e.g., crystal oscillator or "XO") 330 configured to generate a reference clock signal 332. The reference clock signal 332 may have a frequency of 19.2 MHz in one example, but is not limited to such frequency. The reference clock signal 332 is input to the clock generator 324 which generates multiple clock signals based on the reference clock signal 332. In this regard, the clock generator 324 may include a phase locked loop (PLL) or multiple PLLs, in which each PLL generates a respective one of the multiple clock signals by multiplying up the frequency of the reference clock signal 332.

The endpoint device system 350 includes one or more device clients 354. Each device client 354 may be implemented on a processor executing software that performs the functions of the device client 354 discussed herein. For the example of more than one device client 354, the device clients 354 may be implemented on the same processor or different processors. The endpoint device system 350 also includes a device controller 352. The device controller 352 may be configured to receive bandwidth request(s) from one or more device clients, and determine whether to change the number of transmit lines or the number of receive lines based on bandwidth requests. The device controller 352 may be implemented on a processor executing software that performs the functions of the device controller.

The endpoint device system 350 includes a PCIe interface circuit 360, a system bus interface 356, and endpoint system memory 374. The system bus interface 356 may interface the one or more device clients 354 with the device controller 352, and interface each of the one or more device clients 354 and device controllers 352 with the PCIe interface circuit 360 and the endpoint system memory 374. The PCIe interface circuit 360 provides the endpoint device system 350 with an interface to the PCIe link 385. In this regard, the PCIe interface circuit 360 is configured to transmit data (e.g., from the device client 354) to the host system 310 (also referred to as the host device) over the PCIe link 385 and receive data from the host system 310 via the PCIe link 385. The PCIe interface circuit 360 includes a PCIe controller 362, a PIPE interface 364, a PHY TX block 366, a PHY RX block 370, and a clock generator 368. The PIPE interface 364 provides a parallel interface between the PCIe controller 362 and the PHY TX block 366 and the PHY RX block 370. The PCIe controller 362 (which may be implemented in hardware) may be configured to perform transaction layer, data link layer, and control flow functions.

The host system memory 340 and the endpoint system memory 374 at the endpoint may be configured to contain registers for the status of each transmit line and receive line of the PCIe link 385. The transmit lines may be configured as differential transmit line pairs and the receive lines may be configured as differential receive line pairs.

The endpoint device system 350 also includes an oscillator (e.g., crystal oscillator) 372 configured to generate a stable reference clock signal 373 for the endpoint system memory 374 and the clock generator 368. In the example in FIG. 3, the clock generator 324 at the host system 310 is configured to generate a stable EP reference clock signal, which is forwarded to the endpoint device system 350 via a differential clock line 388 by the PHY RX block 326. At the endpoint device system 350, the PHY RX block 370 receives the EP reference clock signal on the differential clock line 388, and forwards the EP reference clock signal to the clock generator 368. The EP reference clock signal may have a frequency of 100 MHz, but is not limited to such frequency. The clock generator 368 is configured to generate multiple clock signals based on the EP reference clock signal from the differential clock line 388, as discussed further below. In this regard, the clock generator 368 may include multiple PLLs, in which each PLL generates a respective one of the multiple clock signals by multiplying up the frequency of the EP reference clock signal.

The system 305 also includes a power management integrated circuit (PMIC) 390 coupled to a power supply 392 e.g., mains voltage, a battery or other power source. The PMIC 390 is configured to convert the voltage of the power supply 392 into multiple supply voltages (e.g., using switch regulators, linear regulators, or any combination thereof). In this example, the PMIC 390 generates voltages 342 for the oscillator 330, voltages 344 for the PCIe controller 318, and voltages 346 for the PHY TX block 322, the PHY RX block 326, and the clock generator 324. The voltages 342, 344, and 346 may be programmable, in which the PMIC 390 is configured to set the voltage levels (corners) of the voltages 342, 344, and 346 according to instructions (e.g., from the host controller 312).

The PMIC 390 also generates a voltage 380 for the oscillator 372, a voltage 378 for the PCIe controller 362, and a voltage 376 for the PHY TX block 366, the PHY RX block 370, and the clock generator 368. The voltages 380, 378, and 376 may be programmable, in which the PMIC 390 is configured to set the voltage levels (corners) of the voltages 380, 378, and 376 according to instructions (e.g., from the device controller 352). The PMIC 390 may be implemented on one or more chips. Although the PMIC 390 is shown as one PMIC in FIG. 3, it is to be appreciated that the PMIC 390 may be implemented by two or more PMICs. For example, the PMIC 390 may include a first PMIC for generating voltages 342, 344, and 346 and a second PMIC for generating voltages 380, 378, and 376. In this example, the first and second PMICs may both be coupled to the same power supply 392 or to different power supplies.

In operation, the PCIe interface circuit 316 on the host system 310 may transmit data from the one or more host clients 314 to the endpoint device system 350 via the PCIe link 385. The data from the one or more host clients 314 may be directed to the PCIe interface circuit 316 according to a PCIe map set up by the host controller 312 during initial configuration, sometimes referred to as Link Initialization, when the host controller negotiates bandwidth for the link. At the PCIe interface circuit 316, the PCIe controller 318 may perform transaction layer and data link layer functions on the data e.g., packetizing the data, generating error correction codes to be transmitted with the data, etc.

The PCIe controller 318 outputs the processed data to the PHY TX block 322 via the PIPE interface 320. The processed data includes the data from the one or more host clients 314 as well as overhead data (e.g., packet header, error correction code, etc.). In one example, the clock generator 324 may generate a clock 334 for an appropriate data rate or transfer rate based on the reference clock signal 332, and input the clock 334 to the PCIe controller 318 to time operations of the PCIe controller 318. In this example, the PIPE interface 320 may include a 22-bit parallel bus that transfers 22-bits of data to the PHY TX block in parallel for each cycle of the clock 334. At 250 MHz this translates to a transfer rate of approximately 8 GT/s.

The PHY TX block 322 serializes the parallel data from the PCIe controller 318 and drives the PCIe link 385 with the serialized data. In this regard, the PHY TX block 322 may include one or more serializers and one or more drivers. The clock generator 324 may generate a high-frequency clock for the one or more serializers based on the reference clock signal 332.

At the endpoint device system 350, the PHY RX block 370 receives the serialized data via the PCIe link 385, and deserializes the received data into parallel data. In this regard, the PHY RX block 370 may include one or more receivers and one or more deserializers. The clock generator 368 may generate a high-frequency clock for the one or more deserializers based on the EP reference clock signal. The PHY RX block 370 transfers the deserialized data to the PCIe controller 362 via the PIPE interface 364. The PCIe controller 362 may recover the data from the one or more host clients 314 from the deserialized data and forward the recovered data to the one or more device clients 354.

On the endpoint device system 350, the PCIe interface circuit 360 may transmit data from the one or more device clients 354 to the host system memory 340 via the PCIe link 385. In this regard, the PCIe controller 362 at the PCIe interface circuit 360 may perform transaction layer and data link layer functions on the data e.g., packetizing the data, generating error correction codes to be transmitted with the data, etc. The PCIe controller 362 outputs the processed data to the PHY TX block 366 via the PIPE interface 364. The processed data includes the data from the one or more device clients 354 as well as overhead data (e.g., packet header, error correction code, etc.). In one example, the clock generator 368 may generate a clock based on the EP reference clock through a differential clock line 388, and input the clock to the PCIe controller 362 to control time operations of the PCIe controller 362.

The PHY TX block 366 serializes the parallel data from the PCIe controller 362 and drives the PCIe link 385 with the serialized data. In this regard, the PHY TX block 366 may include one or more serializers and one or more drivers. The clock generator 368 may generate a high-frequency clock for the one or more serializers based on the EP reference clock signal.

At the host system 310, the PHY RX block 326 receives the serialized data via the PCIe link 385, and deserializes the received data into parallel data. In this regard, the PHY RX block 326 may include one or more receivers and one or more deserializers. The clock generator 324 may generate a high-frequency clock for the one or more deserializers based on the reference clock signal 332. The PHY RX block 326 transfers the deserialized data to the PCIe controller 318 via the PIPE interface 320. The PCIe controller 318 may recover the data from the one or more device clients 354 from the deserialized data and forward the recovered data to the one or more host clients 314.

Sideband Voltage Negotiation

The current PCIe standard (e.g., M.2 standard) allows a PCIe adapter and a PCIe platform to negotiate the sideband voltage level to either 1.8V or 3.3V. In some applications, voltage level translator (e.g., voltage level shifters) can be used if there is a sideband voltage level mismatch between the PCIe adapter and PCIe platform. For backward compatibility, current PCIe adapter implementations typically negotiate to 3.3V sideband voltage level (worst case), which may require the use of space-consuming level shifters on the adapter and/or platform. While a PCIe adapter may support lower sideband voltages (e.g., 1.8V), there is currently no standardized way for the PCIe adapter to communicate its sideband voltage capability to the PCIe platform. Aspects of the disclosure provide backward compatible techniques for sideband voltage negotiation that enable a PCIe adapter and a PCIe platform to negotiate to lower sideband voltages. The techniques can be implemented using a voltage control pin that enables sideband communication without the need for a voltage level shifter.

Figure 4:
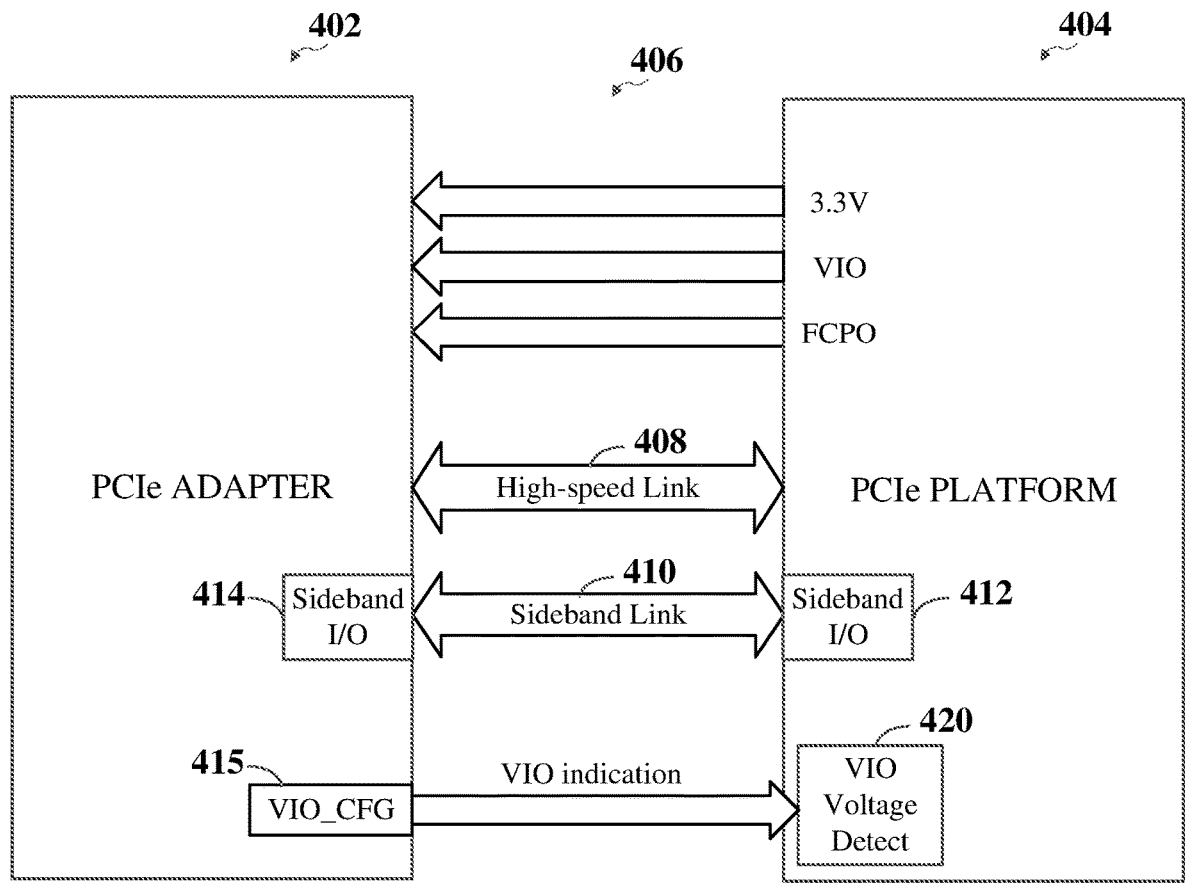
FIG. 4 is a diagram illustrating techniques for negotiating and controlling sideband voltages according to some aspects of the present disclosure.

FIG. 4 is a diagram illustrating techniques for negotiating and controlling sideband voltages according to some aspects of the disclosure. A PCIe adapter 402 and a PCIe platform 404 can be connected by a PCIe interface 406 that is similar to the PCIe interface described above in connection with FIGS. 2 and 3. In some aspects, the PCIe adapter 402 can be implemented by the endpoint device system 350, and the PCIe platform can be implemented by the host system 310. The PCIe interface 406 can include a high-speed link 408 and a sideband link 410. The sideband link 410 can include various sideband signals, for example, PCIe reset (PERST #), PCIe clock request (CLKREQ #), PCIe wake (PEWAKE #), power loss notification (PLN #), power loss acknowledge (PLA #), etc.

In some aspects, the PCIe adapter 402 can be configured to support one or more sideband voltage levels (e.g., voltage levels 0.8V, 1.2V, 1.8V, and 3.3V). The PCIe adapter 402 can advertise or indicate one or more supported sideband voltage levels to the PCIe platform 404 before the PCIe adapter 402 is fully powered on (e.g., received 3.3V and input offset voltage (VIO)). For example, to fully power on the PCIe adapter 402, the PCIe platform 404 supplies 3.3V, VIO voltage in a predetermined sequence to the PCIe adapter. In some aspects, the PCIe platform 404 can send an FCPO (Full Card Power On) signal to indicate that the PCIe adapter 402 is powered on. The PCIe adapter 402 and PCIe platform 404 may implement the same or different sideband voltage levels. Before fully powering up the PCIe adapter 402 or the high speed link 408, the PCIe platform 404 can compare and select a compatible sideband voltage level based on the supported sideband voltage(s) indicated by the PCIe adapter 402. If the PCIe platform 404 supports compatible sideband voltage(s), the PCIe platform 404 can continue with the process to fully enable and power up the PCIe interface. Otherwise, if no compatible sideband voltage level is available, the PCIe platform 404 does not power on the PCIe adapter 402.

To fully power on the PCIe adapter 402, the PCIe platform 404 configures its sideband IO pads 412 to use the compatible sideband voltage level and applies 3.3V power to the PCIe adapter 402. Then, the PCIe platform 404 can supply VIO voltage that matches the selected sideband voltage. The PCIe adapter 402 can use the VIO voltage to configure its sideband IO pad 414 so that it matches the sideband IO pad voltage of the PCIe platform 404. Then, the PCIe platform 404 can provide a "turn-on" signal (e.g., FCPO) to power up the PCIe adapter 402, which locks in the IO pad voltage.

In some aspects, the PCIe adapter 402 can advertise or indicate its supported or compatible sideband voltage(s) using the VIO_CFG pin 415 (e.g., an input-output voltage configuration pin). The PCIe platform 404 can detect or read the voltage at the VIO_CFG pin 415 to determine the sideband voltage level(s) advertised by the PCIe adapter 402. In one aspect, the PCIe platform 404 may be provided with VIO voltage detection circuitry 420 that can detect the voltage level at the VIO CFG pin 415. In some aspects, the VIO voltage detection circuitry 420 may be configured to convert the voltage (an analog signal) detected at the VIO_CFG pin 415 to corresponding digital data based on a predetermined rule or mapping. In one example, the VIO voltage detection circuitry 420 may include an analog-to-digital (A/D) converter that can convert the VIO_CFG voltage (a sideband voltage indication signal) to corresponding digital values.

Table 1 illustrates some non-limiting examples of VIO_CFG voltages and corresponding sideband voltage levels according to some aspects. In some aspects, the VIO_CFG voltage design can be backward compatible with the current PCIe M.2 specification. For example, setting VIO_CFG voltage to 0V to signal 3.3V sideband support and 1.8V to signal 1.8V sideband support may be consistent with the current M.2 specification. In one example, the VIO_CFG voltage can have a voltage (e.g., 0V, 0.8V, 1.2V, or 1.8V) that indicates a single compatible sideband voltage. At least one VIO_CFG voltage can indicate two or more compatible sideband voltages. In one example, the VIO_CFG voltage can have a voltage (e.g., 0.2V, 0.4V, or 0.6V) that indicates two or more compatible sideband voltages. For example, the voltage may be a medium voltage between a supply voltage (e.g. 1.8V) and ground. Since a single VIO_CFG voltage can signal multiple compatible sideband voltages (2 or more), it enables a PCIe adapter and a PCIe platform to negotiate to lower sideband voltages and avoids the use of a voltage level translator or default to a higher voltage. In other aspects, the VIO_CFG voltages and corresponding sideband voltage levels may have other designs and are not limited to the design shown in Table 1.

TABLE 1

| Compatible Sideband Voltage | VIO_CFG voltage |
| --- | --- |
| 3.3 V | 0 V or ground |
| 3.3 V and 1.8 V | 0.2 V |
| 1.8 V | 1.8 V |
| 1.8 V and 1.2 V | 0.4 V |
| 1.2 V | 1.2 V |
| 1.2 V and 0.8 V | 0.6 V |
| 0.8 V | 0.8 V |
| Reserved | 1.5 V or supply voltage |

In one example, when the PCIe adapter 402 advertises sideband voltage support for 1.8V and 1.2V (e.g., VIO_CFG voltage is set to 0.4V), the PCIe platform 404 does not power on the PCIe adapter 402 when the PCIe platform only supports 3.3V sideband voltage. In one example, when the PCIe adapter 402 advertises sideband voltage support for 1.8V and 1.2V (e.g., VIO_CFG voltage is set to 0.4V), and the PCIe platform 404 can support 1.8V, the PCIe platform powers on the PCIe adapter 402 and set sideband voltage to 1.8V. In one example, when the PCIe adapter 402 advertises sideband voltage support for 1.8V and 1.2V (e.g., VIO_CFG voltage is set to 0.4V), and the PCIe platform 404 can support 1.2V, the PCIe platform 404 powers on the PCIe adapter 402 and set sideband voltage to 1.2V. In one example, when the PCIe adapter 402 advertises sideband voltage support for 0.8V and 1.2V (e.g., VIO_CFG voltage is set to 0.6V), the PCIe platform 404 does not power on the PCIe adapter 402 when the PCIe platform only supports 1.8V sideband voltage.

Figure 5:
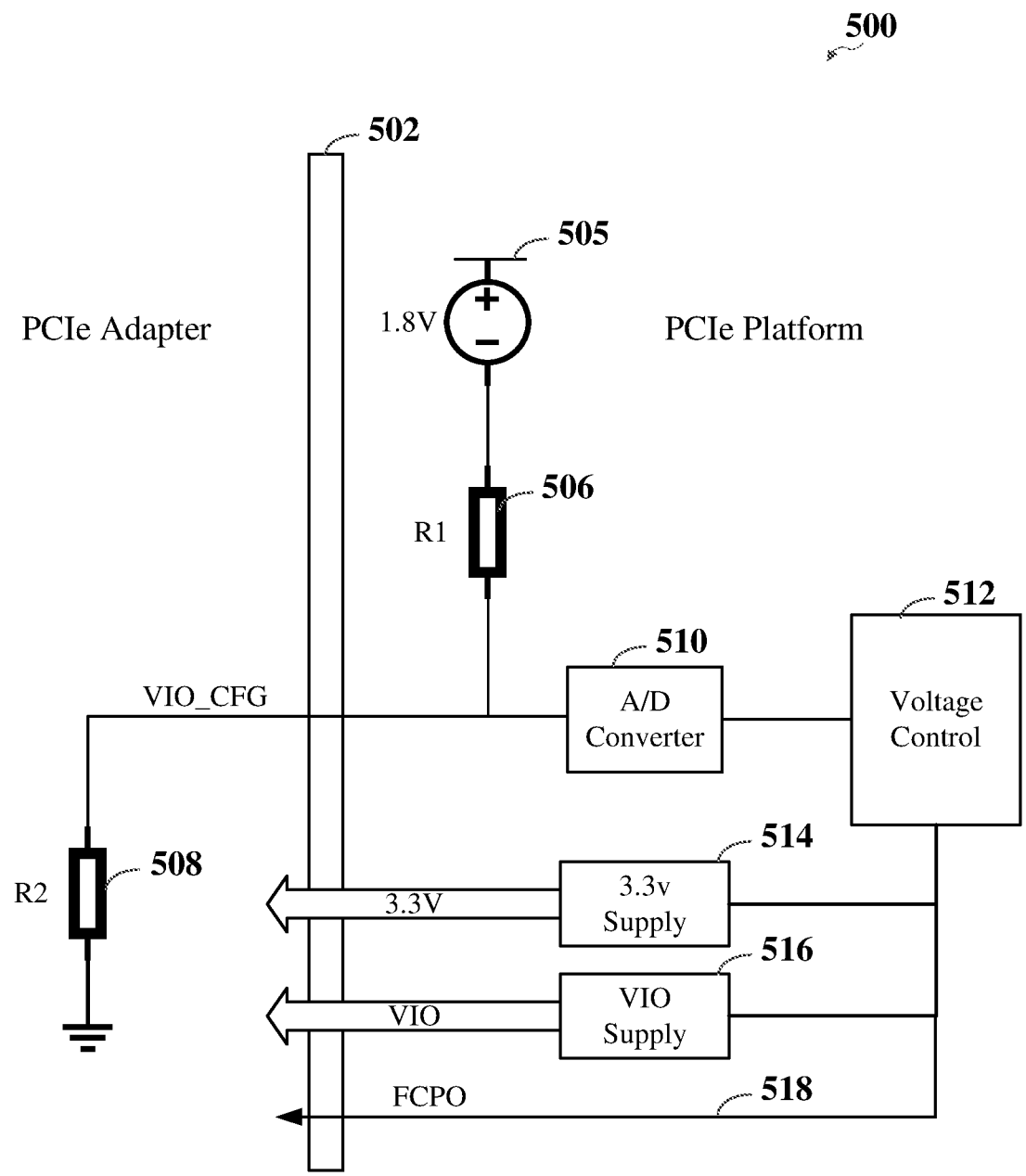
FIG. 5 is a diagram illustrating circuitry configured for indicating and controlling PCIe sideband voltages according to some aspects of the present disclosure.

FIG. 5 is a diagram illustrating voltage indication circuitry 500 configured for communicating and controlling PCIe sideband voltages according to some aspects of the disclosure. In some aspects, the PCIe adapter 402 and PCIe platform 504 can be connected to each other via a PCIe connector 502 on the PCIe platform. The PCIe connector 502 can be implemented in various form factors, for example, a M.2 connector form factor. In one example, the PCIe connector 502 can be implemented by an edge connector with multiple pins (or pads) on the PCIe adapter and a mating connector on the PCIe platform. The PCIe platform may supply a power supply voltage, e.g., DC voltage 505 (e.g., 1.8V), to the VIO_CFG pin via a first resistor (R1) 506, and the PCIe adapter may provide a second resistor (R2) 508 between the VIO_CFG pin and an electrical ground (ground voltage). In this example, the first resistor 506 and the second resistor 508 form a voltage divider that outputs the VIO_CFG voltage based on the relative values of the first resistor 506 and second resistor 508. For example, the voltage of the VIO_CFG pin can be determined as 1.8V×(R2/(R1+R2)).

Table 2 below illustrates some exemplary values of the first and second resistors (R1 and R2) for indicating various VIO_CFG voltages. Each of the VIO_CFG voltage can indicate one or more sideband voltages supported by the PCIe adapter. The resistor values are for illustrating the concept only and not limiting. Other suitable resistor values can be used in other examples and designs.

TABLE 2

| Compatible Sideband Voltage | R1 (ohms) | R2 (ohms) | VIO_CFG voltage (analog voltage) |
|---|---|---|---|
| 3.3 V | 100K | 0K | 0 V or ground |
| 3.3 V and 1.8 V | 100K | 12.5K | 0.2 V |
| 1.8 V | 100K | Floating | 1.8 V |
| 1.8 V and 1.2 V | 100K | 28.5K | 0.4 V |
| 1.2 V | 100K | 200K | 1.2 V |
| 1.2 V and 0.8 V | 100K | 50K | 0.6 V |
| 0.8 V | 100K | 80K | 0.8 V |
| Reserved | 100K | 500K | 1.5 V or supply voltage |

In one aspect, the PCIe platform can detect the VIO_CFG voltage level using an A/D converter 510. The A/D converter 510 converts the VIO_CFG voltage (an analog signal) to a digital value or data that represents the detected VIO_CFG voltage in the digital domain. The PCIe platform may have a voltage control circuitry 512 that can perform various voltage control functions, including, configuring the sideband voltage based on the data received from the A/D converter 510. In one aspect, the voltage control circuitry 512 can decode the data from the A/D converter 510 to determine the sideband voltage(s) advertised and supported by the PCIe adapter. In some aspects, the voltage control circuitry 512 may include the A/D converter 510 as a component or provide the functions of the A/D converter 510. The voltage control circuitry 512 can control a 3.3V supply 514 and a VIO supply 516 based on the detected VIO_CFG voltage. In one example, the 3.3V supply 514 can be a voltage regulator that supplies 3.3V. In one example, the VIO supply 516 can be a voltage regulator that supplies VIO voltage (e.g., 3.3V, 1.8V, 1.2V, or 0.8V) to the PCIe adapter. In one example, the voltage control circuitry 512 can output an FCPO signal 518 to the PCIe adapter to indicate that the PCIe platform supplied 3.3V and VIO, and the PCIe adapter can set its sideband voltage based on the VIO voltage. The concept of voltage indication described above in FIG. 5 is not limited to PCIe sideband voltage control and can be applied in other data link examples.

Figure 6:
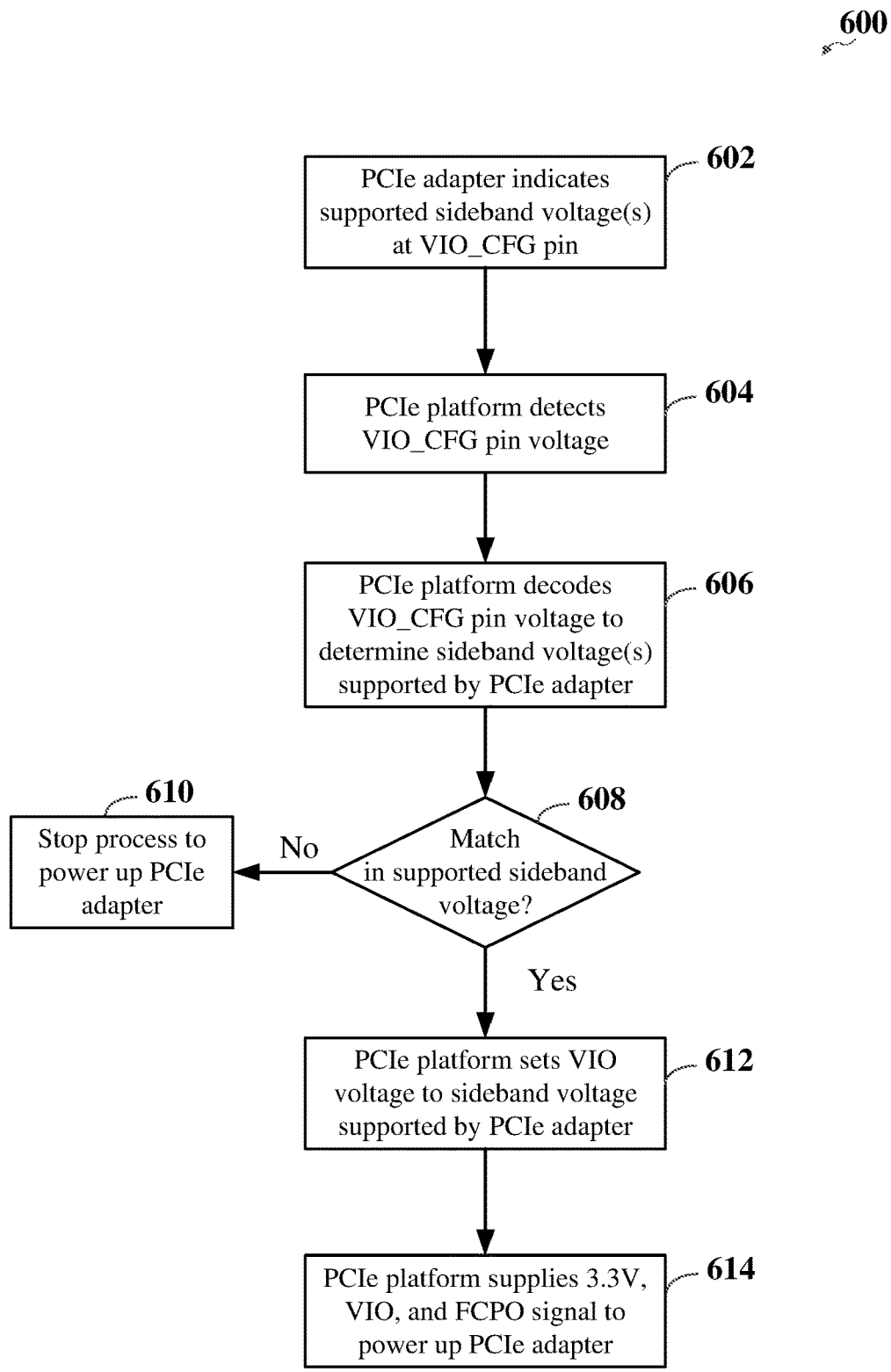
FIG. 6 is a flow chart illustrating a procedure for communicating sideband voltage information between a PCIe adapter and a PCIe platform according to some aspects of the present disclosure.

FIG. 6 is a flow chart illustrating a procedure 600 for communicating sideband voltage information between the PCIe adapter 402 and the PCIe platform 404 according to some aspects of the disclosure. However, the procedure 600 can be performed using other PCIe devices in other examples.

At 602, the PCIe adapter can indicate or advertise one or more supported sideband voltage levels (e.g., 0.8V, 1.2V, 1.8V, and/or 3.3V) using a predetermined voltage (an analog signal) at a VIO_CFG pin. In one aspect, the PCIe adapter can set the voltage at the VIO_CFG pin using a pull-down resistor (e.g., resistor 508) that forms a voltage divider circuit with a pull-up resistor (e.g., resistor 506) provided at the PCIe platform as described above in relation with FIG. 5. In one aspect, the VIO_CFG pin can be set to one of the VIO_CFG voltages in Table 1 and Table 2 to indicate the corresponding sideband voltage(s) supported by the PCIe adapter.

At 604, the PCIe platform can detect the voltage at the VIO_CFG pin using, for example, the VIO voltage detection circuitry 420. In some aspects, the VIO voltage detection circuitry 420 may include the A/D converter 510 and/or the voltage control circuitry 512 that can detect and convert the voltage (an analog signal) at the VIO_CFG pin to corresponding digital data that represents the detected VIO_CFG voltage in the digital domain.

At 606, the PCIe platform can decode the VIO_CFG voltage to determine the sideband voltage(s) that is/are supported by the PCIe adapter. In one aspect, the PCIe platform can use the voltage control circuitry 512 to decode the digital data (e.g., data from A/D converter 510) that represents the voltage detected at the VIO_CFG pin. For example, the decoded digital data can correspond to one of the VIO_CFG voltages in Table 1/2 described above. Then, the PCIe platform can determine the sideband voltage(s) supported by the PCIe adapter based on the decoded VIO_CFG voltage.

At 608, the PCIe platform can determine whether the PCIe platform can supply or operate with a sideband voltage that matches a sideband voltage supported by the PCIe adapter. For example, the voltage control circuitry 512 can determine whether the PCIe platform can supply a sideband voltage that matches or is compatible with a sideband voltage indicated by the PCIe adapter at the VIO_CFG pin.

At 610, if the PCIe platform cannot supply a compatible sideband voltage supported by the PCIe adapter, the PCIe platform will not perform a power-on procedure of the PCIe adapter.

At 612, if the PCIe platform determines that it can supply a sideband voltage that is compatible with or supported by the PCIe adapter, the PCIe platform sets the VIO voltage to a sideband voltage indicated by the PCIe adapter. For example, the PCIe platform can use the voltage control circuitry 512 to set the VIO supply 516 to the desired VIO voltage (e.g., 0.8V, 1.2V, 1.8V, or 3.3V). In some aspects, if the PCIe adapter indicates two or more sideband voltages that are both supported by the PCIe platform, the PCIe platform can select one of the sideband voltages based on a predetermined rule (e.g., prioritize lower voltage for power saving). In a power-on procedure, the PCIe platform supplies 3.3V and VIO to the PCIe adapter in a predetermined sequence.

At 614, the PCIe platform can supply 3.3V and VIO in a predetermined sequence to power up the PCIe adapter. For example, the PCIe platform can use the voltage control circuitry 512 to control the 3.3V supply to provide 3.3V and the VIO supply 516 to provide the VIO voltage. The PCIe platform can further provide the FCPO signal to the PCIe platform to indicate that the PCIe adapter is powered on and VIO voltage is set.

Figure 7:
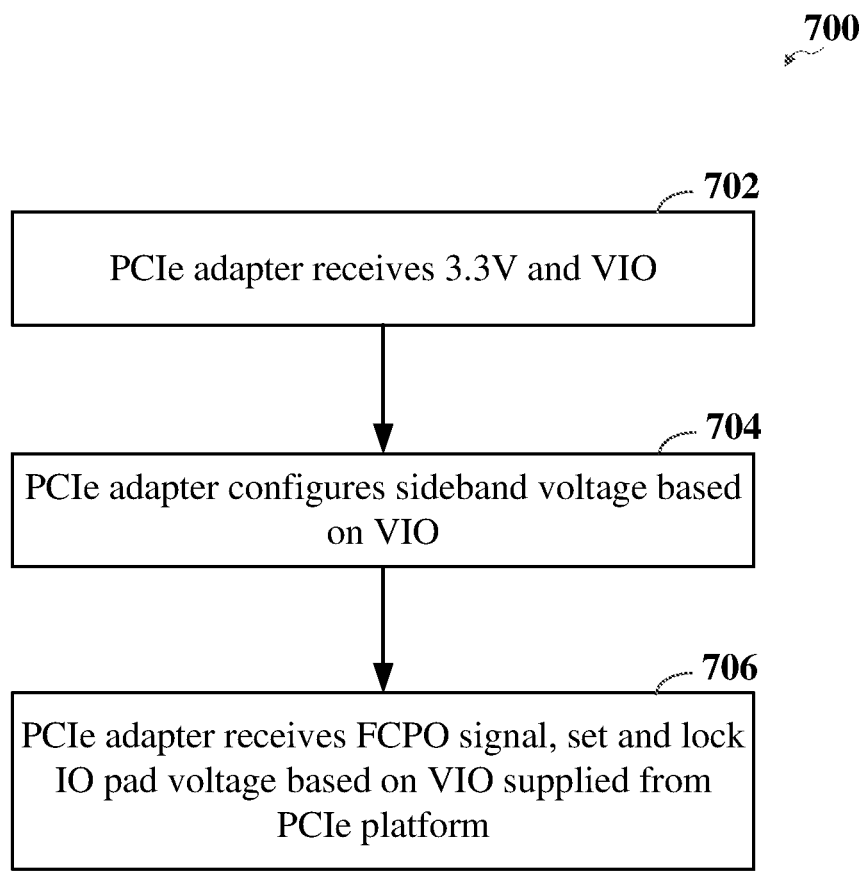
FIG. 7 is a flow chart illustrating a procedure for powering up a PCIe adapter according to some aspects of the present disclosure.

FIG. 7 is a flow chart illustrating a procedure 700 for powering up a PCIe adapter according to some aspects. For example, the procedure 700 can be performed at the PCIe adapter 402 after the PCIe platform 404 determined the sideband voltage supported by the PCIe adapter 402 as described above in FIG. 6. At 702, the PCIe adapter 402 can receive 3.3V and VIO voltage from the PCIe platform 404. The PCIe adapter 402 can receive the 3.3V and VIO voltage at a predetermined sequence, for example, according to a sequence defined in the PCI Express M.2 Specification. In one example, the PCIe platform can supply the 3.3V to the PCIe adapter prior to supplying the VIO voltage.

At 704, the PCIe adapter can configure its sideband interface 414 to the sideband voltage based on the VIO voltage supplied by the PCIe platform. For example, the PCIe adapter can set the operating voltage of its sideband input/output (IO) pads 414 to be the same as or compatible with the VIO voltage (e.g., 0.8V, 1.2V, 1.8V, or 3.3V). At 706, the PCIe adapter can receive a powered-on signal (e.g., FCPO signal) from the PCIe platform. The powered-on signal indicates that the PCIe adapter can be in a fully powered-on state. In one aspect, the PCIe platform can set the powered-on signal to a predetermined voltage level (e.g., 3.3V) that indicates that the PCIe adapter is powered up fully (i.e., 3.3V and VIO voltages are on). In this case, the PCIe adapter can fix its sideband I/O pad voltage to match the VIO voltage received from the PCIe platform.

Figure 8:
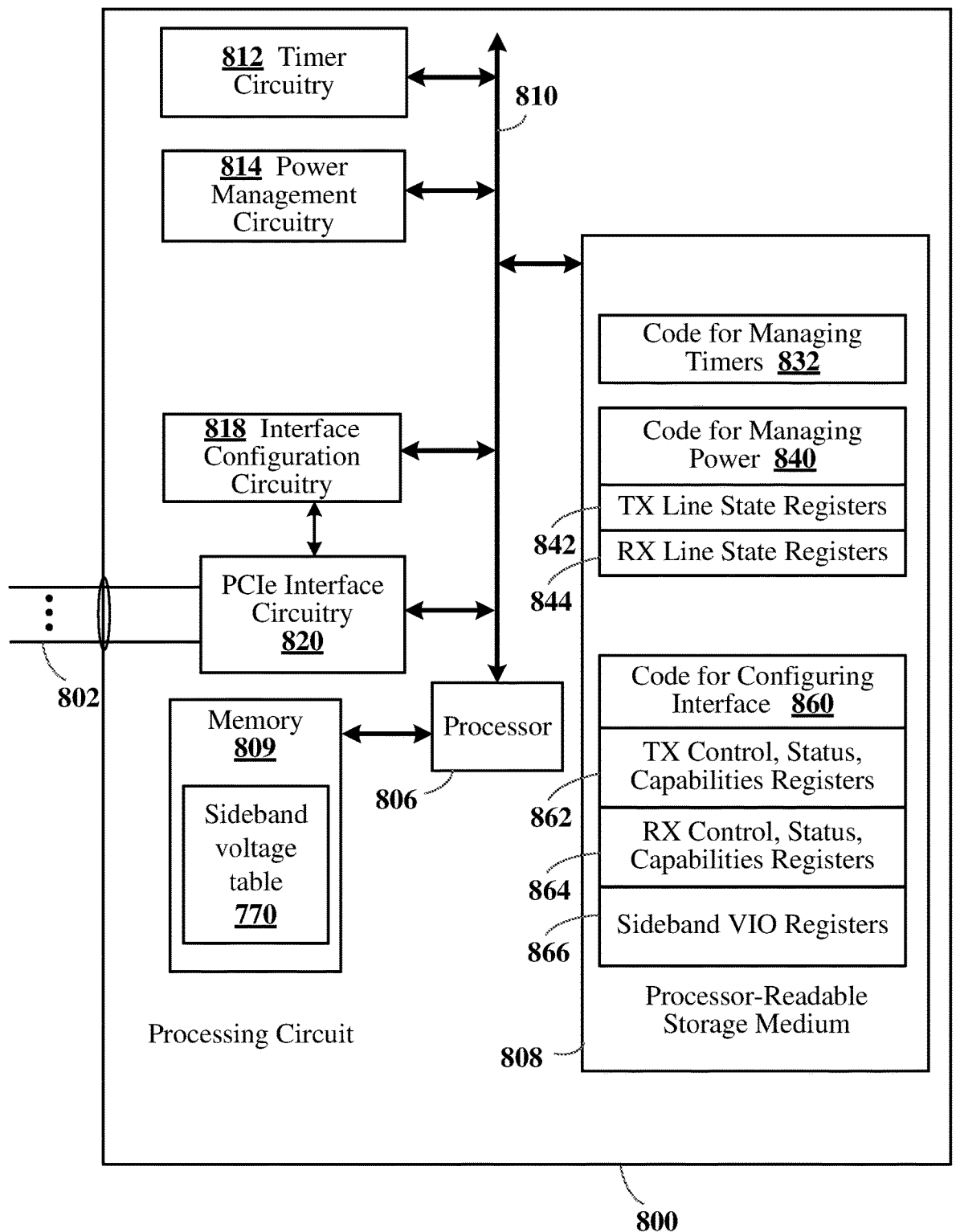
FIG. 8 is a block diagram of a PCIe link interface processing circuit according to aspects of the present disclosure.

FIG. 8 is a block diagram of a link interface processing circuit according to some aspects. The link interface processing circuit 800 is an apparatus that may be a part of a host (e.g., PCIe platform 404) or an endpoint (e.g., PCIe adapter 402). The processing circuit can be coupled to a communication link 802, e.g., a PCIe link, with multiple duplex lanes. The link 802 can be coupled at an opposite end to another PCIe device, e.g., a PCIe endpoint or a PCIe host. Data and control information communicated as packets through the link 802 can be coupled to a link interface (e.g., PCIe interface circuitry 820) which can provide a PHY level interface to the link and convert baseband signals to packets (e.g., data packets and/or control packets). The data and control packets can be sent by the link interface circuitry 820 through a bus 810 to other components of the processing circuit 800. The link interface circuitry 820 can have a direct connection to interface configuration circuitry 818 that can provide configuration and control settings (e.g., sideband voltage setting) for the operation of the link interface circuitry 820.

In some aspects, the link interface circuitry 820 may include circuitry for communicating and controlling PCIe sideband voltages, for example, as the circuitry shown in FIG. 5. In one example, the link interface circuitry 820 may include the PCIe adapter side circuit (e.g., resistor 508) when the link interface circuitry 820 is included in a PCIe adapter (e.g., endpoint). In one example, the link interface circuitry 820 may include the PCIe platform side circuit (e.g., the power supply 505 and resistor 506) when the link interface circuitry 820 is included in a PCIe platform (e.g., host).

The processing circuit 800 can further include timer circuitry 812. The timer circuitry 812 can be coupled to the bus 810 and provide timer functions, for example, controlling various timings used for latency, inactivity, acknowledgement, and/or PCIe power states. In one aspect, the timer circuitry 812 can access a computer-readable storage medium 808 to access code and data for managing the timers 832. In some aspects, the storage medium is a non-transitory computer-readable medium. In some aspects, the timer circuitry 812 may also access registers and data stored in the storage medium 808 or memory 809.

In addition, within the processing circuit 800, power management circuitry 814 can manage the power and voltage used by various components of the processing circuit and PCIe link. The power management circuitry 814 has access through the bus 810 to code for managing PCIe power 840 and to transmit line state registers 842 and receive line state registers 844. These registers may be used to store a state for each transmit line and each receive line, or for a transmit side of a link and a receive side of the link. The state may be determined using the code for managing timers 832, the code for managing PCIe power 840, or in another way.

The interface configuration circuitry 818 is coupled to the bus as are the power management circuitry 814 and the timer circuitry 812 so that each of these blocks may communicate with each other, with the storage medium 808 and to a processor 806. The processor 806 can control the operation of the other circuitry and instigate instances of each circuitry as appropriate to the operation of the processing circuit 800. The interface configuration circuitry 818 also has access to code for configuring the PCIe interface 860. On executing this code, the interface configuration circuitry 818 can read and write values from a variety of configuration registers. For example, these registers include transmit control, status, and capabilities registers 862 and receive control, status, and capabilities registers 864. These registers may be accessed and read at the start of Link Initialization and then updated with the result of the initialization. The registers may also be modified in response to power management and bandwidth negotiations or to change the status of one or more transmit lines or receive lines of the link 802. In some aspects, the interface configuration circuitry 818 may read and write values from one or more sideband VIO registers used for configuring and controlling sideband communication. For example, the interface configuration circuitry 818 and/or PCIe interface circuitry 820 can set the VIO voltage based on a VIO voltage transmitted to an endpoint or received from a host.

The processing circuit 800 may initialize the link 802, manage the power, and change the number of active lines of the link 802. In operation, bandwidth requests may also be received from the host or endpoint. Bandwidth requests may cause a bandwidth negotiation followed by a change in values set to control, status, and capabilities registers.

The power management circuitry 814 may change the voltage levels of one or more of the voltages 376, 378, and 380 by instructing the PMIC 390 to set the voltage levels of one or more of the voltages supplied by the PMIC 390 as shown in FIG. 3. Therefore, a power according to the negotiated bandwidth can managed by supplying one or more voltages to the interface circuit of the link and by setting the levels of the one or more voltages.

Figure 9:
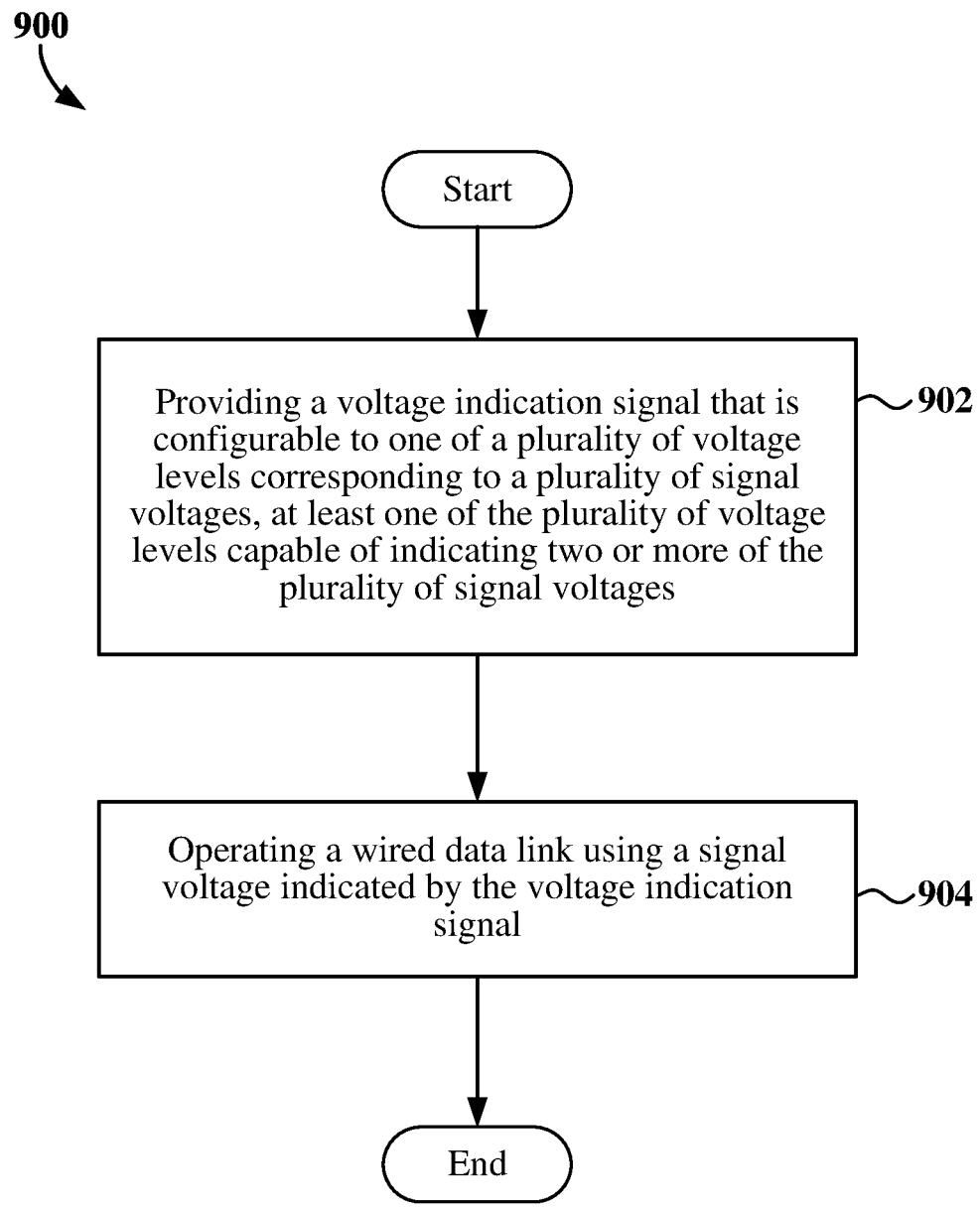
FIG. 9 is a flow chart illustrating a first method for communication interface voltage control according to aspects of the present disclosure.

FIG. 9 illustrates a flow diagram of a method 900 for communication interface voltage control according to aspects of the present disclosure. In certain aspects, the method 900 can be performed by the PCIe adapter 402 to effect sideband voltage level indication and configuration, for example, as described above in relation to FIGS. 4-7. The method 900 is not limited to PCIe applications. In other aspects, the method 900 can be used by an apparatus for indicating and controlling a signal voltage of a wired data link other than PCIe.

At 902, the method 900 includes a process of providing a voltage indication signal that is configurable to one of a plurality of voltage levels corresponding to a plurality of signal voltages. At least one of the plurality of voltage levels is capable of indicating two or more of the plurality of signal voltages. For example, the voltage indication signal may be a sideband voltage indication signal (an analog signal) that is configurable to a plurality of voltage levels corresponding to a plurality of sideband voltages. At least one of the plurality of voltage levels is capable of indicating two or more of the plurality of signal voltages (e.g., sideband voltages 0.8V, 1.2V, 1.8V, and 3.3V for a PCIe link). In one aspect, the plurality of voltage levels can be the VIO_CFG voltages shown in Table 1 and Table 2 described above. For example, voltages 0.2V, 0.4V, and 0.6V each can indicate two sideband voltages which can be compatible with the PCIe adapter 402. In one aspect, the PCIe interface circuitry 820 can be a means to provide the voltage indication signal (e.g., VIO_CFG). For example, the PCIe interface circuitry 820 may include the resistor 508 that can form a voltage divider with a resistor (e.g., resistor 506) of the PCIe platform to provide the VIO_CFG voltage.

At 904, the method 900 includes a process of operating a wired data link (e.g., a PCIe link), using a signal voltage indicated by the voltage indication signal. In one example, the PCIe interface circuitry 820 can provide a means to operate the wired data link (e.g., PCIe link) using a signal voltage indicated by the signal voltage indication (e.g., sideband voltage indication, VIO_CFG). In one aspect, the PCIe interface circuitry 820 may receive 3.3V, VIO, and a FCPO signal from the PCIe platform, and the PCIe interface can set its sideband voltage based on the VIO voltage.

Figure 10:
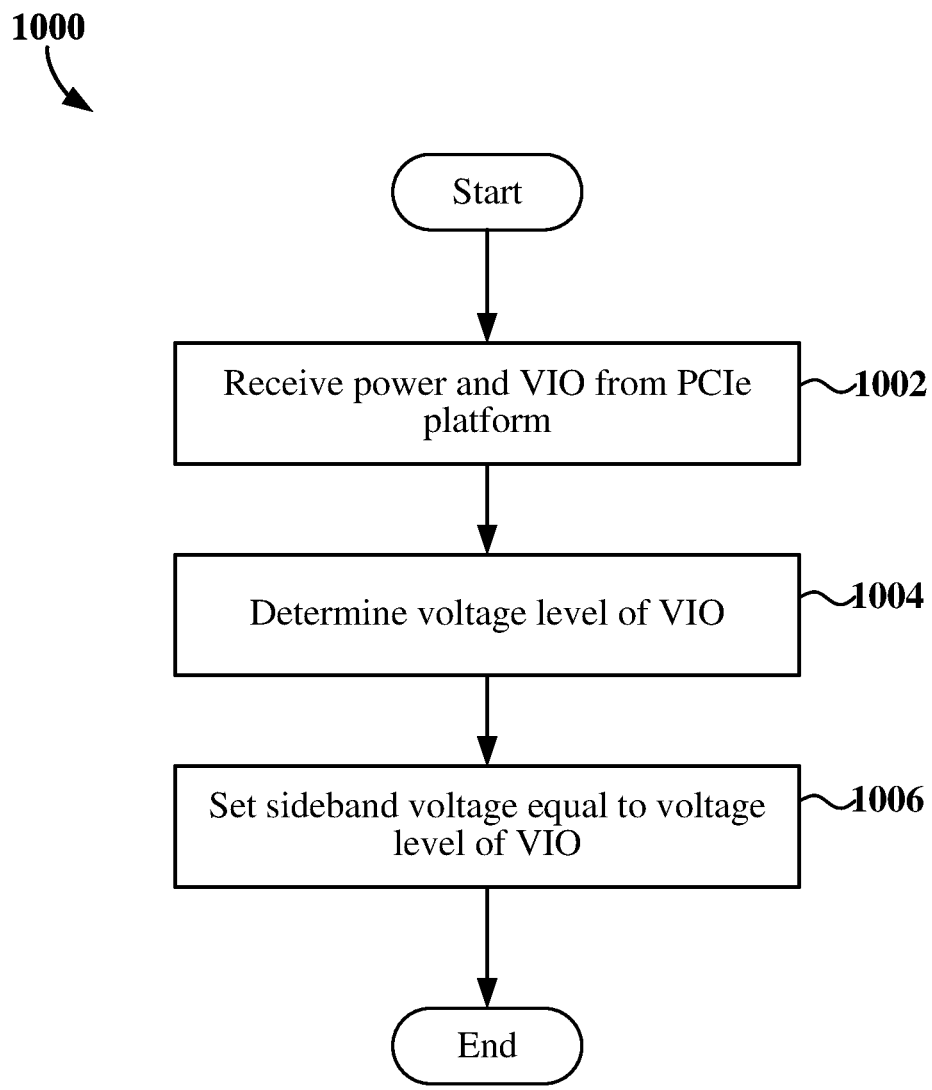
FIG. 10 is a flow chart illustrating a method for determining a sideband voltage at a PCIe adapter according to aspects of the present disclosure.

FIG. 10 illustrates a flow diagram of a method 1000 for setting a sideband voltage at a PCIe adapter according to aspects of the present disclosure. In certain aspects, the method 1000 can be performed by the PCIe adapter 402 at block 904 of method 900 to control a sideband (signal) voltage level of a sideband interface.

At 1002, the method 1000 includes a process of receiving power and VIO from the PCIe platform. For example, the PCIe adapter can receive 3.3V and VIO in a predetermined sequence. At 1004, the method 1000 includes a process of determining a voltage level of VIO. For example, the voltage level of VIO may be a sideband voltage (e.g., 0.8V, 1.2V, 1.8V, or 3.3V) that is advertised by the PCIe adapter. At 1006, the method 1000 includes a process of setting the sideband voltage to be equal to the voltage of VIO. Therefore, the PCIe platform can set the voltage of VIO to a sideband voltage supported by the PCIe adapter.

Figure 11:
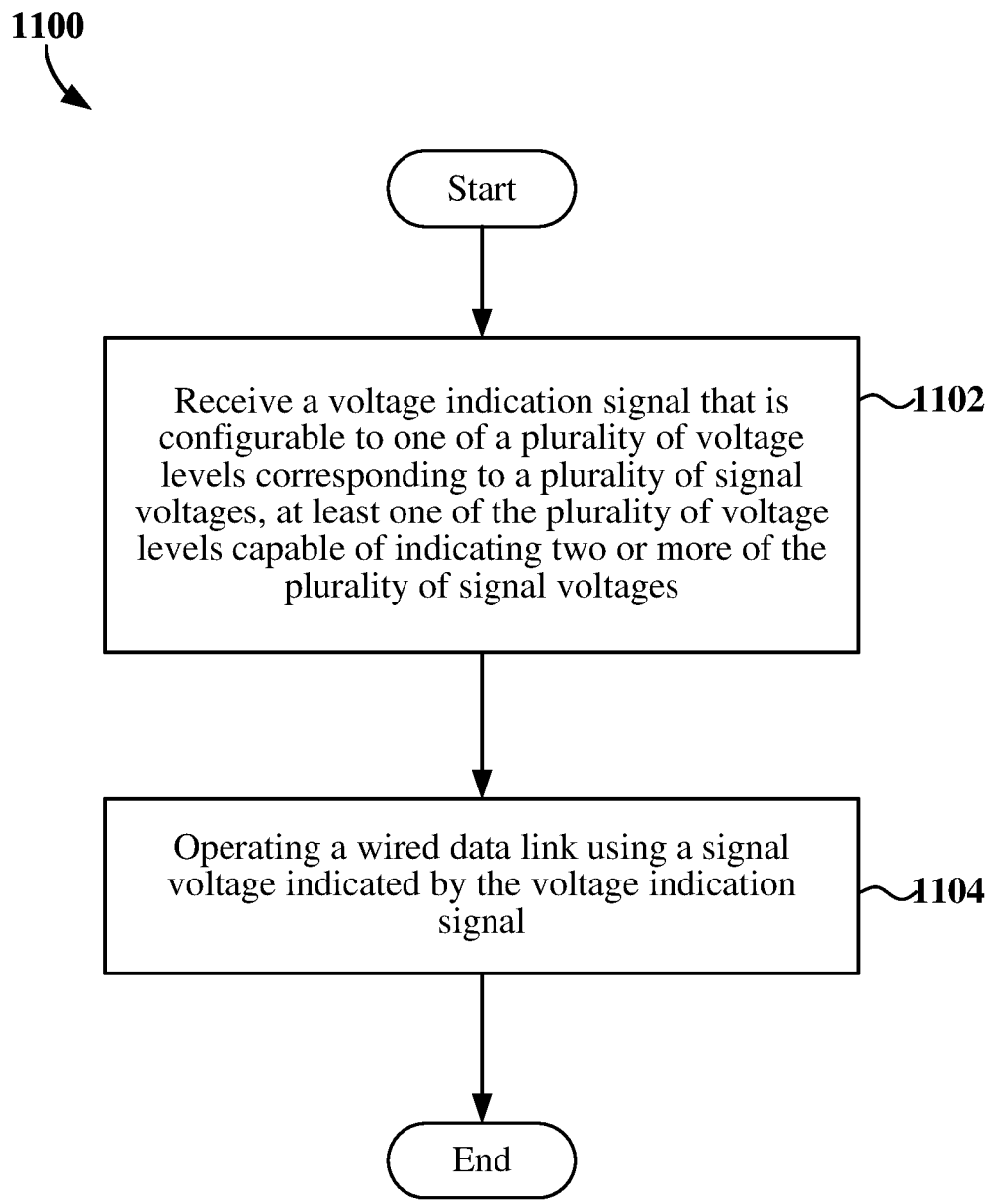
FIG. 11 is a flow chart illustrating a second method for communication interface voltage control according to aspects of the present disclosure.

FIG. 11 illustrates a flow diagram of a method 1100 for communication interface voltage control according to aspects of the present disclosure. In certain aspects, the method 1100 can be performed by the PCIe platform 404 to effect sideband voltage level indication and configuration, for example, as described above in relation to FIGS. 4-7. The method 1100 is not limited to PCIe applications. In other aspects, the method 1100 can be used by an apparatus for indicating and controlling a signal voltage of a wired data link other than PCIe.

At 1102, the method 1100 includes receiving a voltage indication signal (e.g., PCIe sideband voltage indication signal from a PCIe adapter) that is configurable to one of a plurality of voltage levels corresponding to a plurality of signal voltages. At least one of the plurality of voltage levels is capable of indicating two or more of the plurality of signal voltages (e.g., sideband voltages 0.8V, 1.2V, 1.8V, and 3.3V). In one aspect, the plurality of voltage levels can be the VIO_CFG voltages shown in Table 1 and Table 2 described above. For example, voltages 0.2V, 0.4V, and 0.6V each can indicate two sideband voltages that are compatible with the PCIe adapter 402. In one aspect, the PCIe interface circuitry 820 can be a means to receive the voltage indication signal (e.g., VIO_CFG). For example, the PCIe interface circuitry 820 may include the power supply 505 and the resistor 506 that can form a voltage divider with a resistor (e.g., resistor 508) of the PCIe adapter to provide the VIO_CFG.

At 1104, the method 1100 includes a process of operating a wired data link (e.g., a PCIe link with the PCIe adapter), using a signal voltage indicated by the voltage indication signal (e.g., VIO_CFG). In one example, the PCIe interface circuitry 820 can provide a means to operate the PCIe link using a sideband voltage indicated by the sideband voltage indication. The PCIe interface circuitry 820 may supply 3.3V, VIO, and a FCPO signal to the PCIe adapter, and the PCIe interface can set its sideband voltage based on the VIO voltage.

Figure 12:
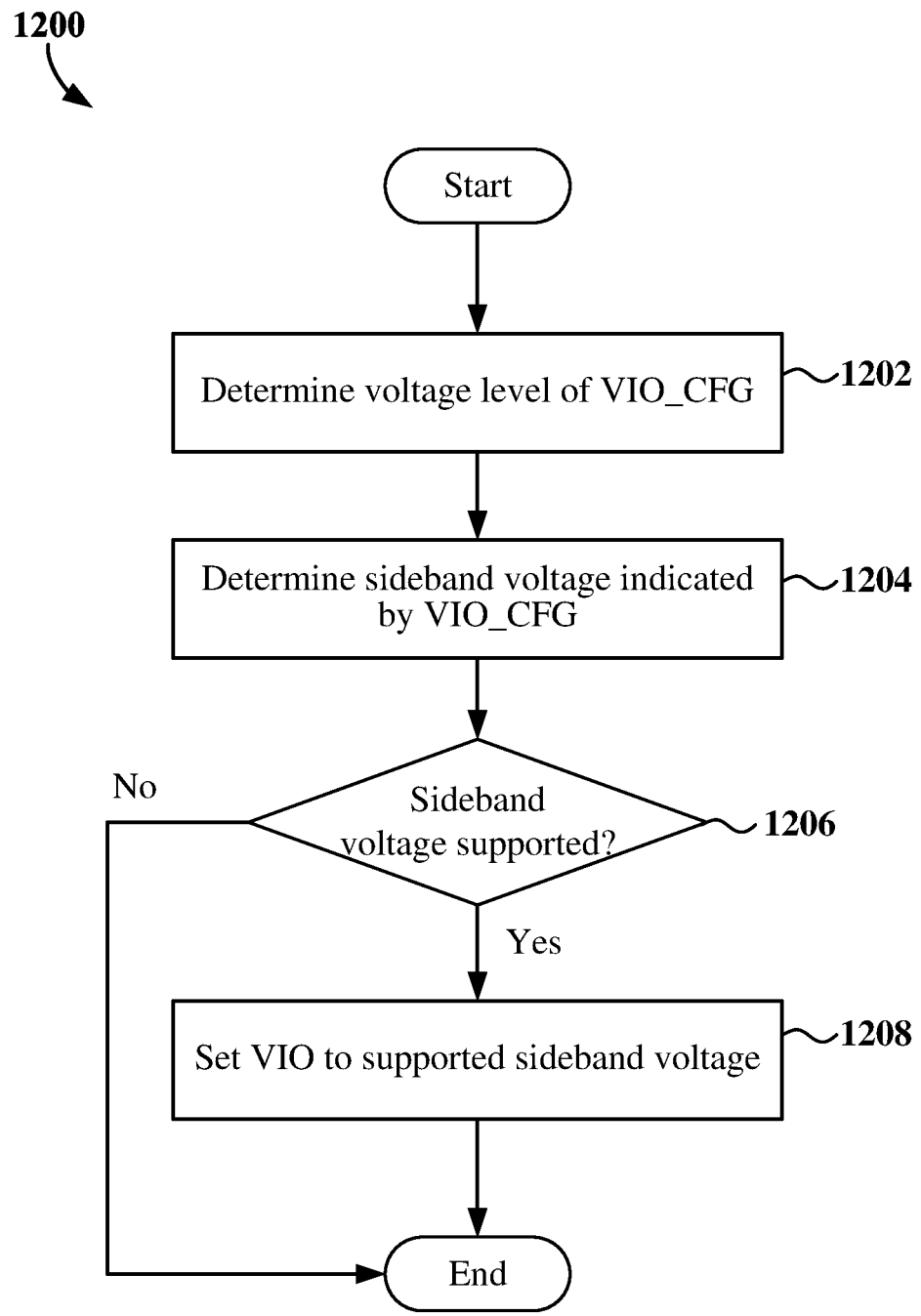
FIG. 12 is a flow chart illustrating a method for determining a sideband voltage at a PCIe platform according to aspects of the present disclosure.

FIG. 12 illustrates a flow diagram of a method 1200 for determining a sideband voltage at a PCIe platform according to aspects of the present disclosure. In certain aspects, the method 1200 can be performed by the PCIe platform 404 at block 1104 of method 1100 to control a sideband voltage level of a sideband interface.

At 1202, the method 1200 includes a process of determining a voltage level of VIO_CFG (e.g., a sideband voltage indication). The VIO_CFG signal (e.g., an analog signal) can indicate the sideband voltage supported by a PCIe adapter. In one aspect, the A/D converter 510 can provide a means to determine the voltage level of VIO_CFG. At 1204, the method 1200 includes a process of determining a sideband voltage indicated by the VIO_CFG. In one aspect, the voltage control circuitry 512 can provide a means to determine the sideband voltage indicated by the VIO_CFG, for example, based on a sideband voltage table 870 stored in the memory 809. The sideband voltage table 870 can map various VIO_CFG voltages to compatible sideband voltages (e.g., Table 1 or Table 2).

At 1206, the method 1200 determines whether the sideband voltage(s) indicated by VIO_CFG is supported by the PCIe platform. In one aspect, the voltage control circuitry 512 can provide a means to determine whether the sideband voltage(s) indicated by VIO_CFG is supported by the PCIe platform. The VIO_CFG may indicate that the PCIe adapter can support one or more sideband voltages (e.g., 0.8V, 1.2, 1.8V, and 3.3V). At 1208, if the PCIe platform can support at least one sideband voltage indicated by VIO_CFG, the PCIe platform can set the VIO voltage to the supported sideband voltage and supply power (e.g., 3.3V and VIO) to the PCIe adapter. Otherwise, the PCIe platform does not power up the PCIe adapter.

Figure 13:
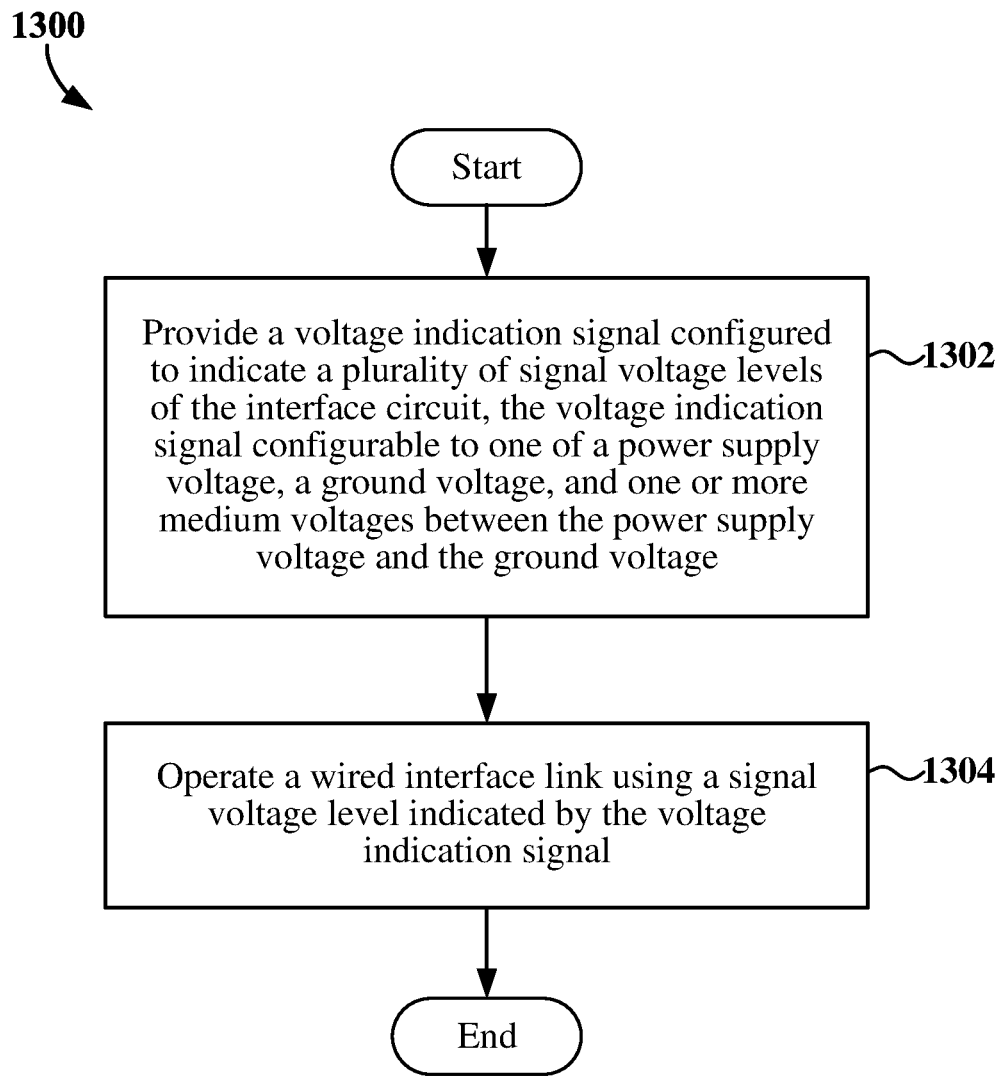
FIG. 13 is a flow diagram illustrating a third method for communication interface voltage control according to aspects of the present disclosure.

FIG. 13 illustrates a flow diagram of a method 1300 for communication interface voltage control according to aspects of the present disclosure. In certain aspects, the method 1300 can be performed by the PCIe adapter 402 to effect sideband voltage level indication and configuration, for example, as described above in relation to FIGS. 5-8. The method 1300 is not limited to PCIe applications. In other aspects, the method 1300 can be used by an apparatus for indicating and controlling a signal voltage of a wired data link other than PCIe.

At 1302, the method 1300 includes a process of providing a voltage indication signal configured to indicate a plurality of signal voltage levels of an interface circuit, the voltage indication signal configurable to one of a power supply voltage, a ground voltage, and one or more medium voltages between the power supply voltage and the ground voltage. For example, the power supply voltage (e.g., 3.3V or 1.8V) is higher than the ground voltage (e.g., 0V), and the one or more medium voltages are lower than the power supply voltage and higher than the ground voltage. At least one of the voltages can be configured to indicate a plurality of signal voltage levels (e.g., sideband voltages 0.8V, 1.2V, 1.8V, and/or 3.3V).

At 1304, the method 1300 includes a process of operating a wired data link using a signal voltage level indicated by the voltage indication signal. In some aspects, the wired data link may be a PCIe link In one example, the PCIe interface circuitry 820 can provide a means to operate the PCIe link (wired data link) using a sideband voltage indicated by the sideband voltage indication (e.g., VIO_CFG).

Figure 14:
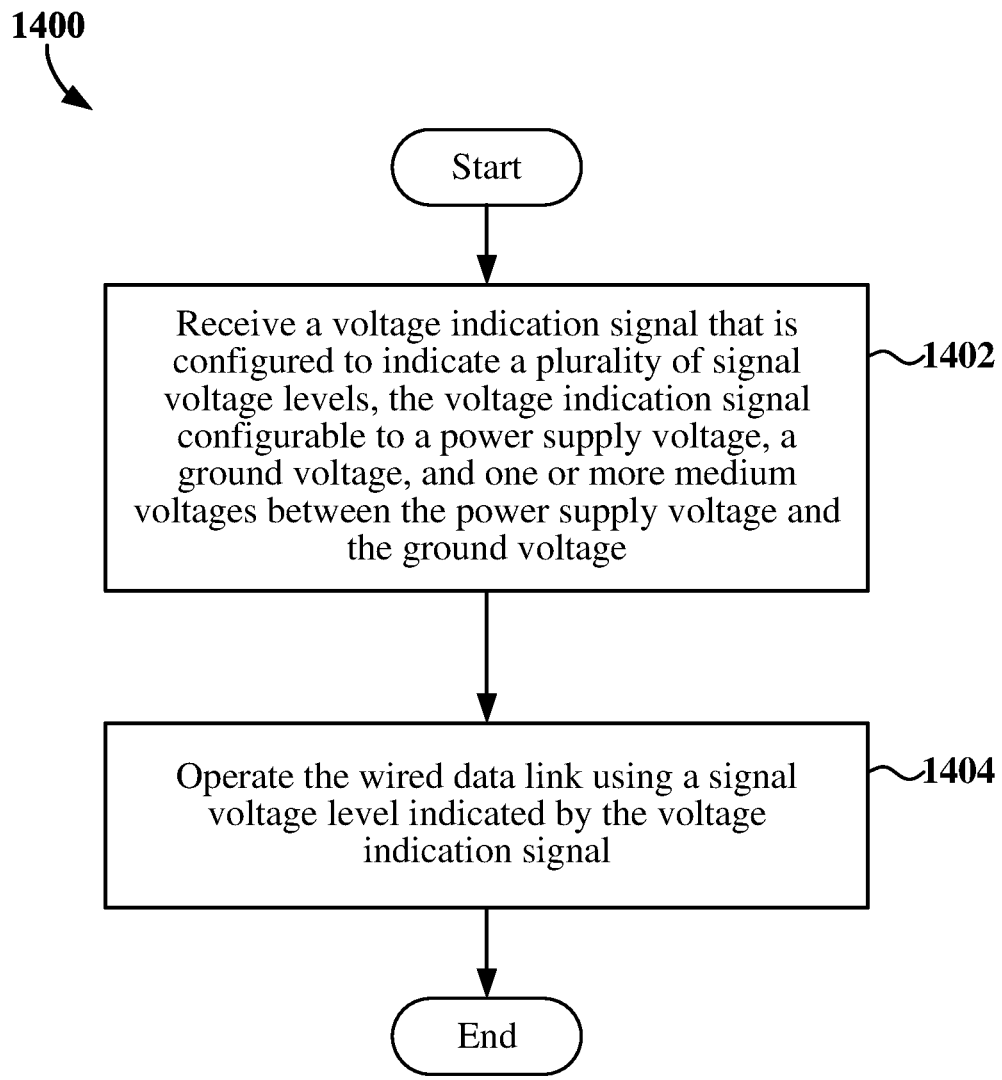
FIG. 14 is a flow diagram illustrating a fourth method for communication interface voltage control according to aspects of the present disclosure.

FIG. 14 illustrates a flow diagram of a method 1400 for communication interface voltage control according to aspects of the present disclosure. In certain aspects, the method 1400 can be performed by the PCIe platform 404 to effect sideband voltage level indication and configuration, for example, as described above in relation to FIGS. 5-8. The method 1400 is not limited to PCIe applications. In other aspects, the method 1400 can be used by an apparatus for indicating and controlling a signal voltage of a wired data link other than PCIe.

At 1402, the method 1400 includes a process of receiving a voltage indication signal that is configured to indicate a plurality of signal voltage levels, the voltage indication signal configurable to a power supply voltage, a ground voltage, and one or more medium voltages between the power supply voltage and the ground voltage. For example, the power supply voltage (e.g., 3.3V or 1.8V) is higher than the ground voltage (e.g., 0V), and the medium voltages are lower than the power supply voltage and higher than the ground voltage. At least one of the medium voltages can be configured to indicate a plurality of signal voltage levels (e.g., sideband voltages 0.8V, 1.2V, 1.8V, and/or 3.3V).

At 1404, the method 1400 further includes a process of operating a wired data link using a signal voltage level indicated by the voltage indication signal. In one example, the PCIe interface circuitry 820 can provide a means to operate the PCIe link (wired data link) using a sideband voltage indicated by the sideband voltage indication (e.g., VIO_CFG). The PCIe interface circuitry 820 may receive 3.3V, VIO, and a FCPO signal from a PCIe platform, and the PCIe interface can set its sideband voltage based on the VIO voltage.

The following provides an overview of examples of the present disclosure.

A first aspect of disclosure provides an apparatus comprising: an interface circuit configured to provide an interface with a wired data link, the interface circuit further configured to provide a voltage indication signal that is configurable to a plurality of voltage levels corresponding to a plurality of signal voltages, at least one of the plurality of voltage levels capable of indicating two or more of the plurality of signal voltages; and a controller configured to operate the wired data link using a signal voltage indicated by the voltage indication signal.

A second aspect of the disclosure, alone or in combination with the first aspect, wherein the plurality of voltage levels comprise: a first voltage level indicating that the wired data link is operable at a first signal voltage; a second voltage level indicating that the wired data link is operable at a second signal voltage; and a third voltage level indicating that the wired data link is operable at the first signal voltage or the second signal voltage.

A third aspect of the disclosure, alone or in combination with any of the first to second aspects, wherein the plurality of signal voltages comprise 0.8V, 1.2V, 1.8V, and 3.3V.

A fourth aspect of the disclosure, alone or in combination with the first aspect, wherein the interface circuit is further configured to output the voltage indication signal at an input-output voltage configuration pin of the apparatus.

A fifth aspect of the disclosure, alone or in combination with any of the first, second, and fourth aspects, wherein the interface circuit is further configured to control a voltage level of the voltage indication signal in cooperation with a peripheral component interconnect express (PCIe) platform connected to the apparatus.

A sixth aspect of the disclosure, alone or in combination with the fifth aspect, wherein the interface circuit is further configured to control the voltage level of the voltage indication signal before the apparatus receives power from the PCIe platform for operating the wired data link.

A seventh aspect of the disclosure, alone or in combination with the fifth aspect, wherein the interface circuit comprises a first resistor that is configured to form a voltage divider with a second resistor in the PCIe platform, an output of the voltage divider corresponding to the voltage level of the voltage indication signal.

An eighth aspect of the disclosure provides a method of operating an apparatus for data communication, comprising: providing a voltage indication signal that is configurable to a plurality of voltage levels corresponding to a plurality of signal voltages, at least one of the plurality of voltage levels capable of indicating two or more of the plurality of signal voltages; and operating a wired data link using a signal voltage indicated by the voltage indication signal.

A ninth aspect of the disclosure, alone or in combination with the eighth aspect, wherein the plurality of voltage levels comprise: a first voltage level indicating that the wired data link is operable at a first signal voltage; a second voltage level indicating that the wired data link is operable at a second signal voltage; and a third voltage level indicating that the wired data link is operable at the first signal voltage or the second signal voltage.

A tenth aspect of the disclosure, alone or in combination with any of the eighth to ninth aspects, wherein the plurality of signal voltages comprise 0.8V, 1.2V, 1.8V, and 3.3V.

An eleventh aspect of the disclosure, alone or in combination with the eighth aspect, wherein the providing the voltage indication signal comprises: outputting the voltage indication signal at an input-output voltage configuration pin of the apparatus.

A twelfth aspect of the disclosure, alone or in combination with any of the eighth, ninth, and eleventh aspects, the method further comprises: controlling a voltage level of the voltage indication signal in cooperation with a peripheral component interconnect express (PCIe) platform connected to the apparatus.

A thirteenth aspect of the disclosure, alone or in combination with the twelfth aspect, the method further comprises: controlling the voltage level of the voltage indication signal before receiving power from the PCIe platform for operating the data link.

A fourteenth aspect of the disclosure, alone or in combination with the twelfth aspect, wherein the controlling the voltage level of the voltage indication signal comprises: controlling the voltage level of the voltage indication signal using a first resistor that is configured to form a voltage divider with a second resistor in the PCIe platform, an output of the voltage divider corresponding to the voltage level of the voltage indication signal.

A fifteenth aspect of the disclosure provides an apparatus for data communication, comprising: an interface circuit configured to provide an interface with a wired data link, configured to receive a voltage indication signal that is configurable to a plurality of voltage levels corresponding to a plurality of signal voltages, at least one of the plurality of voltage levels capable of indicating two or more of the plurality of signal voltages; and a controller configured to operate the wired data link using a signal voltage indicated by the voltage indication signal.

A sixteenth aspect of the disclosure, alone or in combination with the fifteenth aspect, wherein the plurality of voltage levels comprise: a first voltage level indicating that the wired data link is operable at a first signal voltage; a second voltage level indicating that the wired data link is operable at a second signal voltage; and a third voltage level indicating that the wired data link is operable at the first signal voltage or the second signal voltage.

A seventeenth aspect of the disclosure, alone or in combination with any of the fifteenth and sixteenth aspects, wherein the plurality of signal voltages comprise 0.8V, 1.2V, 1.8V, and 3.3V.

An eighteenth aspect of the disclosure, alone or in combination with any of the fifteenth and sixteenth aspects, wherein the interface circuit is further configured to detect a voltage level of the voltage indication signal in cooperation with a peripheral component interconnect express (PCIe) adapter connected to the apparatus.

A nineteenth aspect of the disclosure, alone or in combination with the eighteenth aspect, wherein the interface circuit is further configured to detect the voltage level of the voltage indication signal before supplying power to the PCIe adapter for operating the data link.

A twentieth aspect of the disclosure, alone or in combination with the eighteenth aspect, wherein the interface circuit comprises a first resistor that is configured to form a voltage divider circuit with a second resistor in the PCIe adapter, an output of the voltage divider circuit corresponding to the voltage level of the voltage indication signal.

A twenty-first aspect of the disclosure provides a method of operating an apparatus for data communication, comprising: receiving a voltage indication signal that is configurable to a plurality of voltage levels corresponding to a plurality of signal voltages, at least one of the plurality of voltage levels capable of indicating two or more of the plurality of signal voltages; and operating a wired data link using a signal voltage indicated by the voltage indication signal.

A twenty-second aspect of the disclosure, alone or in combination with the twenty-first aspect, wherein the plurality of voltage levels comprise: a first voltage level indicating that the wired data link is operable at a first signal voltage; a second voltage level indicating that the wired data link is operable at a second signal voltage; and a third voltage level indicating that the wired data link is operable at the first signal voltage or the second signal voltage.

A twenty-third aspect of the disclosure, alone or in combination with any of the twenty-first and twenty-second aspects, wherein the plurality of signal voltages comprise 0.8V, 1.2V, 1.8V, and 3.3V.

A twenty-fourth aspect of the disclosure, alone or in combination with any of the twenty-first and twenty-second aspects, the method further comprises: detecting a voltage level of the voltage indication signal in cooperation with a peripheral component interconnect express (PCIe) adapter connected to the apparatus.

A twenty-fifth aspect of the disclosure, alone or in combination with the twenty-fourth aspect, further comprising: detecting the voltage level of the sideband voltage indication signal before supplying power to the PCIe adapter for operating the data link.

A twenty-sixth aspect of the disclosure, alone or in combination with the twenty-fourth aspect, the method further comprises: detecting the voltage level of the voltage indication signal using a first resistor that is configured to form a voltage divider with a second resistor in the PCIe adapter, an output of the voltage divider corresponding to the voltage level of the voltage indication signal.

A twenty-seven aspect of the disclosure provides an apparatus for data communication, comprising: an interface circuit configured to provide an interface with a wired data link, the interface circuit further configured to provide a voltage indication signal configured to indicate a plurality of signal voltage levels of the interface circuit, the voltage indication signal configurable to one of a power supply voltage, a ground voltage, and one or more medium voltages between the power supply voltage and the ground voltage; and a controller configured to operate the wired data link using a signal voltage level indicated by the voltage indication signal.

A twenty-eight aspect of the disclosure, alone or in combination with the twenty-seventh aspect, wherein the voltage indication signal is configured to indicate at least one of: the interface circuit operatable at 3.3V and 1.8V; the interface circuit operatable at 1.8V and 1.2V; or the interface circuit operatable at 1.2V and 0.8V.

A twenty-ninth aspect of the disclosure, alone or in combination with the twenty-seventh aspect, wherein the interface circuit is further configured to output the voltage indication signal at an input-output voltage configuration pin of the apparatus.

A thirtieth aspect of the disclosure, alone or in combination with any of the twenty-seventh to twenty-ninth aspects, wherein the interface circuit is further configured to control a voltage level of the voltage indication signal in cooperation with a peripheral component interconnect express (PCIe) platform connected to the apparatus.

A thirty-first aspect of the disclosure, alone or in combination with the thirtieth aspect, wherein the interface circuit is further configured to control the voltage level of the voltage indication signal before the apparatus receives power from the PCIe platform for operating the wired data link.

A thirty-second aspect of the disclosure, alone or in combination with the thirtieth aspect, wherein the interface circuit comprises a first resistor that is configured to form a voltage divider with a second resistor in the PCIe platform, an output of the voltage divider corresponding to the voltage level of the voltage indication signal.

A thirty-third aspect of the disclosure provides an apparatus for data communication, comprising: an interface circuit configured to provide an interface with a wired data link, configured to receive a voltage indication signal that is configured to indicate a plurality of signal voltage levels, the voltage indication signal configurable to a power supply voltage, a ground voltage, and one or more medium voltages between the power supply voltage and the ground voltage; and a controller configured to operate the wired data link using a signal voltage level indicated by the voltage indication signal.

A thirty-fourth aspect of the disclosure, alone or in combination with the thirty-third aspect, wherein the voltage indication signal is configured to indicate at least one of: the interface circuit operatable at 3.3V and 1.8V; the interface circuit operatable at 1.8V and 1.2V; or the interface circuit operatable at 1.2V and 0.8V.

A thirty-fifth aspect of the disclosure, alone or in combination with any of the thirty-third and thirty-fourth aspects, wherein the interface circuit is further configured to detect a voltage level of the voltage indication signal in cooperation with a peripheral component interconnect express (PCIe) adapter connected to the apparatus.

A thirty-sixth aspect of the disclosure, alone or in combination with the thirty-fifth aspect, wherein the interface circuit is further configured to detect the voltage level of the voltage indication signal before supplying power to the PCIe adapter for operating the wired data link.

A thirty-seventh aspect of the disclosure, alone or in combination with the thirty-fifth aspect, wherein the interface circuit comprises a first resistor that is configured to form a voltage divider circuit with a second resistor in the PCIe adapter, an output of the voltage divider circuit corresponding to the voltage level of the voltage indication signal.

It is to be appreciated that the present disclosure is not limited to the exemplary terms used above to describe aspects of the present disclosure. For example, bandwidth may also be referred to as throughput, data rate or another term.

Although aspects of the present disclosure are discussed above using the example of the PCIe standard, it is to be appreciated that present disclosure is not limited to this example, and may be used with other standards.

The host clients 314, the host controller 312, the device controller 352 and the device clients 354 discussed above may each be implemented with a controller or processor configured to perform the functions described herein by executing software including code for performing the functions. The software may be stored on a non-transitory computer-readable storage medium, e.g., a RAM, a ROM, an EEPROM, an optical disk, and/or a magnetic disk, shows as host system memory 340, endpoint system memory 374, or as another memory.

Any reference to an element herein using a designation e.g., "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect electrical or other communicative coupling between two structures. Also, the term "approximately" means within ten percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus for data communication, comprising:
    an interface circuit configured to provide an interface with a wired data link, the interface circuit further configured to provide a voltage indication signal that is configurable to one of a plurality of voltage levels corresponding to a plurality of signal voltages, at least one of the plurality of voltage levels capable of indicating two or more of the plurality of signal voltages; and
    a controller configured to operate the wired data link using a signal voltage indicated by the voltage indication signal.

2. The apparatus of claim 1, wherein the plurality of voltage levels comprise:
    a first voltage level indicating that the wired data link is operable at a first signal voltage;
    a second voltage level indicating that the wired data link is operable at a second signal voltage; and
    a third voltage level indicating that the wired data link is operable at the first signal voltage and the second signal voltage.

3. The apparatus of claim 1, wherein the plurality of signal voltages comprise 0.8V, 1.2V, 1.8V, and 3.3V.

4. The apparatus of claim 1, wherein the interface circuit is further configured to output the voltage indication signal at an input-output voltage configuration pin of the apparatus.

5. The apparatus of claim 1, wherein the interface circuit is further configured to control a voltage level of the voltage indication signal in cooperation with a peripheral component interconnect express (PCIe) platform connected to the apparatus.

6. The apparatus of claim 5, wherein the interface circuit is further configured to control the voltage level of the voltage indication signal before the apparatus receives power from the PCIe platform for operating the wired data link.

7. The apparatus of claim 5, wherein the interface circuit comprises a first resistor that is configured to form a voltage divider with a second resistor in the PCIe platform, an output of the voltage divider corresponding to the voltage level of the voltage indication signal.

8. A method of operating an apparatus for data communication, comprising:
    providing a voltage indication signal that is configurable to one of a plurality of voltage levels corresponding to a plurality of signal voltages, at least one of the plurality of voltage levels capable of indicating two or more of the plurality of signal voltages; and
    operating a wired data link using a signal voltage indicated by the voltage indication signal.

9. The method of claim 8, wherein the plurality of voltage levels comprise:
   a first voltage level indicating that the wired data link is operable at a first signal voltage;
   a second voltage level indicating that the wired data link is operable at a second signal voltage; and
   a third voltage level indicating that the wired data link is operable at the first signal voltage or the second signal voltage.

10. The method of claim 8, wherein the plurality of signal voltages comprise 0.8V, 1.2V, 1.8V, and 3.3V.

11. The method of claim 8, wherein the providing the voltage indication signal comprises:
   outputting the voltage indication signal at an input-output voltage configuration pin of the apparatus.

12. The method of claim 8, further comprising:
   controlling a voltage level of the voltage indication signal in cooperation with a peripheral component interconnect express (PCIe) platform connected to the apparatus.

13. The method of claim 12, further comprising:
   controlling the voltage level of the voltage indication signal before receiving power from the PCIe platform for operating the wired data link.

14. The method of claim 12, wherein the controlling the voltage level of the voltage indication signal comprises:
   controlling the voltage level of the voltage indication signal using a first resistor that is configured to form a voltage divider with a second resistor in the PCIe platform, an output of the voltage divider corresponding to the voltage level of the voltage indication signal.

15. An apparatus for data communication, comprising:
   An interface circuit configured to provide an interface with a wired data link, configured to receive a voltage indication signal that is configurable to one of a plurality of voltage levels corresponding to a plurality of signal voltages, at least one of the plurality of voltage levels capable of indicating two or more of the plurality of signal voltages; and
   a controller configured to operate the wired data link using a signal voltage indicated by the voltage indication signal.

16. The apparatus of claim 15, wherein the plurality of voltage levels comprise:
   a first voltage level indicating that the wired data link is operable at a first signal voltage;
   a second voltage level indicating that the wired data link is operable at a second signal voltage; and
   a third voltage level indicating that the wired data link is operable at the first signal voltage or the second signal voltage.

17. The apparatus of claim 15, wherein the plurality of signal voltages comprise 0.8V, 1.2V, 1.8V, and 3.3V.

18. The apparatus of claim 15, wherein the interface circuit is further configured to detect a voltage level of the voltage indication signal in cooperation with a peripheral component interconnect express (PCIe) adapter connected to the apparatus.

19. The apparatus of claim 18, wherein the interface circuit is further configured to detect the voltage level of the voltage indication signal before supplying power to the PCIe adapter for operating the wired data link.

20. The apparatus of claim 18, wherein the interface circuit comprises a first resistor that is configured to form a voltage divider circuit with a second resistor in the PCIe adapter, an output of the voltage divider circuit corresponding to the voltage level of the voltage indication signal.

21. A method of operating an apparatus for data communication, comprising:
   receiving a voltage indication signal that is configurable to one of a plurality of voltage levels corresponding to a plurality of signal voltages, at least one of the plurality of voltage levels capable of indicating two or more of the plurality of signal voltages; and
   operating a wired data link using a signal voltage indicated by the voltage indication signal.

22. The method of claim 21, wherein the plurality of voltage levels comprise:
   a first voltage level indicating that the wired data link is operable at a first signal voltage;
   a second voltage level indicating that the wired data link is operable at a second signal voltage; and
   a third voltage level indicating that the wired data link is operable at the first signal voltage or the second signal voltage.

23. The method of claim 21, wherein the plurality of signal voltages comprise 0.8V, 1.2V, 1.8V, and 3.3V.

24. The method of claim 21, further comprising:
   detecting a voltage level of the voltage indication signal in cooperation with a peripheral component interconnect express (PCIe) adapter connected to the apparatus.

25. The method of claim 24, further comprising:
   detecting the voltage level of the voltage indication signal before supplying power to the PCIe adapter for operating the wired data link.

26. The method of claim 24, further comprising:
   detecting the voltage level of the voltage indication signal using a first resistor that is configured to form a voltage divider with a second resistor in the PCIe adapter, an output of the voltage divider corresponding to the voltage level of the voltage indication signal.

27. An apparatus for data communication, comprising:
   an interface circuit configured to provide an interface with a wired data link, the interface circuit further configured to provide a voltage indication signal configured to indicate a plurality of signal voltage levels of the interface circuit, the voltage indication signal configurable to one of a power supply voltage, a ground voltage, and one or more medium voltages between the power supply voltage and the ground voltage; and
   a controller configured to operate the wired data link using a signal voltage level indicated by the voltage indication signal.

28. The apparatus of claim 27, wherein the voltage indication signal is configured to indicate at least one of:
   the interface circuit operatable at 3.3V and 1.8V;
   the interface circuit operatable at 1.8V and 1.2V; or
   the interface circuit operatable at 1.2V and 0.8V.

29. The apparatus of claim 27, wherein the interface circuit is further configured to output the voltage indication signal at an input-output voltage configuration pin of the apparatus.

30. The apparatus of claim 27, wherein the interface circuit is further configured to control a voltage level of the voltage indication signal in cooperation with a peripheral component interconnect express (PCIe) platform connected to the apparatus.

31. The apparatus of claim 30, wherein the interface circuit is further configured to control the voltage level of the voltage indication signal before the apparatus receives power from the PCIe platform for operating the wired data link.

32. The apparatus of claim 30, wherein the interface circuit comprises a first resistor that is configured to form a voltage divider with a second resistor in the PCIe platform, an output of the voltage divider corresponding to the voltage level of the voltage indication signal.

33. An apparatus for data communication, comprising:

An interface circuit configured to provide an interface with a wired data link, configured to receive a voltage indication signal that is configured to indicate a plurality of signal voltage levels, the voltage indication signal configurable to a power supply voltage, a ground voltage, and one or more medium voltages between the power supply voltage and the ground voltage; and a controller configured to operate the wired data link using a signal voltage level indicated by the voltage indication signal.

34. The apparatus of claim 33, wherein the voltage indication signal is configured to indicate at least one of:

the interface circuit operatable at 3.3V and 1.8V;

the interface circuit operatable at 1.8V and 1.2V; or the interface circuit operatable at 1.2V and 0.8V.

35. The apparatus of claim 33, wherein the interface circuit is further configured to detect a voltage level of the voltage indication signal in cooperation with a peripheral component interconnect express (PCIe) adapter connected to the apparatus.

36. The apparatus of claim 35, wherein the interface circuit is further configured to detect the voltage level of the voltage indication signal before supplying power to the PCIe adapter for operating the wired data link.

37. The apparatus of claim 35, wherein the interface circuit comprises a first resistor that is configured to form a voltage divider circuit with a second resistor in the PCIe adapter, an output of the voltage divider circuit corresponding to the voltage level of the voltage indication signal.

* * * * *